(12) United States Patent
Hashimoto et al.

(10) Patent No.: US 9,543,022 B2
(45) Date of Patent: Jan. 10, 2017

(54) SEMICONDUCTOR MEMORY DEVICE

(71) Applicant: KABUSHIKI KAISHA TOSHIBA, Tokyo (JP)

(72) Inventors: Toshifumi Hashimoto, Fujisawa Kanagawa (JP); Yusuke Umezawa, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/055,302

(22) Filed: Feb. 26, 2016

(65) Prior Publication Data
US 2016/0267991 A1    Sep. 15, 2016

(30) Foreign Application Priority Data
Mar. 12, 2015 (JP) .................................. 2015-049716

(51) Int. Cl.
| G11C 11/34 | (2006.01) |
| G11C 16/10 | (2006.01) |
| H01L 27/115 | (2006.01) |
| H01L 23/522 | (2006.01) |

(52) U.S. Cl.
CPC ........... *G11C 16/10* (2013.01); *H01L 23/5226* (2013.01); *H01L 27/1157* (2013.01); *H01L 27/11582* (2013.01)

(58) Field of Classification Search
CPC .. G11C 16/10; H01L 23/5226; H01L 27/1157; H01L 27/11582

USPC ........................ 365/185.03, 185.05, 185.06, 185.11, 365/185.13, 185.17, 185.18, 185.24

See application file for complete search history.

(56) References Cited

U.S. PATENT DOCUMENTS

| 8,218,358 | B2 | 7/2012 | Katsumata et al. |
| 8,837,225 | B2 | 9/2014 | Higuchi et al. |
| 2012/0243296 | A1* | 9/2012 | Watanabe ............... G11C 11/16 365/148 |

* cited by examiner

*Primary Examiner* — Fernando Hidalgo
(74) *Attorney, Agent, or Firm* — Patterson & Sheridan, LLP

(57) ABSTRACT

A semiconductor memory device includes first and second plugs formed on a semiconductor substrate, a word line between the first and second plugs and above the semiconductor substrate, a first semiconductor pillar extending above the semiconductor substrate through the word line, a second semiconductor pillar extending above the semiconductor substrate through the word line, a first bit line electrically connected to the first semiconductor pillar, and a second bit line electrically connected to the second semiconductor pillar. When writing same data in a first memory cell, which is electrically connected to the first bit line, and a second memory cell, which is electrically connected to the second bit line, a first voltage is applied to the first bit line and a second voltage that is different from the first voltage is applied to the second bit line.

20 Claims, 18 Drawing Sheets

SEMICONDUCTOR MEMORY DEVICE

CROSS-REFERENCE TO RELATED APPLICATION

This application is based upon and claims the benefit of priority from Japanese Patent Application No. 2015-049716, filed Mar. 12, 2015, the entire contents of which are incorporated herein by reference.

FIELD

Embodiments described herein relate generally to a semiconductor memory device.

BACKGROUND

A NAND-type flash memory in which memory cells are three-dimensionally arranged is known.

DETAILED DESCRIPTION

Figure 1:
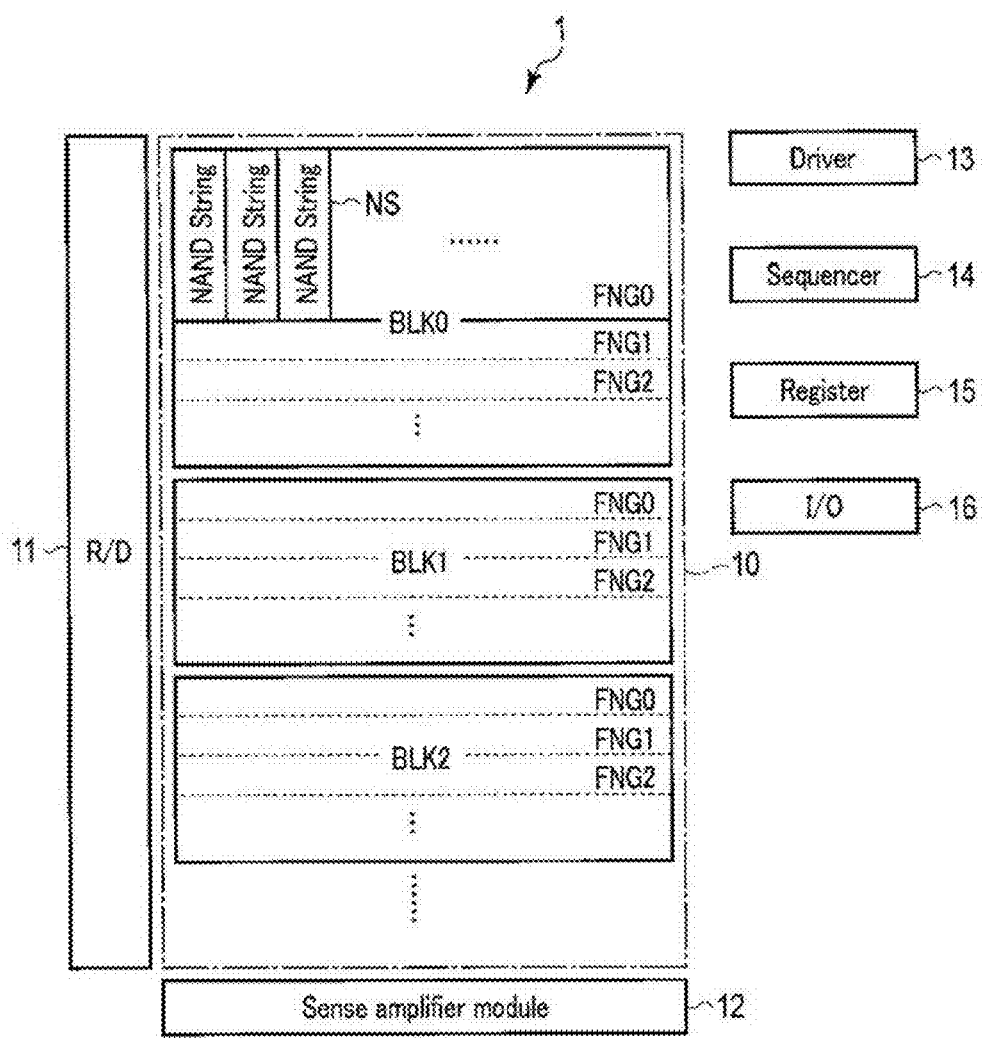
FIG. 1 is a block diagram of a semiconductor memory device according to a first embodiment.

Embodiments now will be described more fully hereinafter with reference to the accompanying drawings. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the invention. As used herein, the singular forms "a," "an" and "the" are intended to include plural forms as well, unless the context clearly indicates otherwise. It will be further understood that the terms "comprises," "comprising," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (and/or variations thereof), it may be directly on or extend directly onto the other element or intervening elements may also be present. In contrast, when an element is referred to as being "directly on" or extending "directly onto" another element (and/or variations thereof), there are no intervening elements present. It will also be understood that when an element is referred to as being "connected" or "coupled" to another element (and/or variations thereof), it may be directly connected or coupled to the other element or intervening elements may be present. In contrast, when an element is referred to as being "directly connected" or "directly coupled" to another element (and/or variations thereof), there are no intervening elements present.

It will be understood that, although the terms first, second, etc. may be used herein to describe various elements, components, regions, layers and/or sections, such elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. For example, when the structure in the Figure is turned over, elements described as being on the "backside" of substrate would then be oriented on "upper" surface of the substrate. The exemplary term "upper", may therefore, encompasses both an orientation of "lower" and "upper," depending on the particular orientation of the figure. Similarly, when the structure in one of the figures is turned over, elements described as "below" or "beneath" other elements would then be oriented "above" the other elements. The exemplary terms "below" or "beneath" may, therefore, encompass both an orientation of above and below.

Embodiments are described herein with reference to cross section and perspective illustrations that are schematic illustrations of the embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Embodiments provide a semiconductor memory device which may improve reliability of data.

In general, according to one embodiment, a semiconductor memory device includes first and second plugs formed on a semiconductor substrate, a word line between the first and second plugs and above the semiconductor substrate, a first semiconductor pillar extending above the semiconductor substrate through the word line, a second semiconductor pillar extending above the semiconductor substrate through the word line, a first bit line that is electrically connected to the first semiconductor pillar, and a second bit line that is electrically connected to the second semiconductor pillar. When writing same data in a first memory cell, which is electrically connected to the first bit line and a second memory cell, which is electrically connected to the second bit line, a first voltage is applied to the first bit line and a second voltage that is different from the first voltage is applied to the second bit line.

Hereinafter, exemplary embodiments will be described with reference to the drawings. In the following description, elements having the same function and configuration will be denoted by the same reference numerals.

First Embodiment

[1] Overall Configuration

An overall configuration of a semiconductor memory device 1 will be described with reference to FIG. 1.

The semiconductor memory device 1 includes a memory cell array 10, a row decoder (R/D) 11, a sense amplifier module 12, a driver 13, a sequencer (controller) 14, a register 15, and an input/output circuit (I/O) 16.

The memory cell array 10 includes a plurality of blocks BLK (BLK0, BLK1, BLK2, . . . ) each of which includes a plurality of non-volatile memory cells correlated with a word line and a bit line. The block BLK is, for example, a unit of data erasure, and data in the same block BLK are collectively erased. The erase operation is, however, not limited to this, and the other erase operations as described in U.S. patent application Ser. No. 13/235,389, filed on Sep. 18, 2011, entitled "Non-volatile semiconductor memory device," and U.S. patent application Ser. No. 12/694,690, filed on Jan. 27, 2010, entitled "Non-volatile semiconductor memory device." The entire contents of these patent applications are incorporated herein by reference. Each block BLK includes a plurality of fingers FNG (FNG0, FNG1, FNG2, . . . ) which is a set of NAND strings NS in each of which memory cells are connected in series. The number of blocks in the memory cell array 10 and the number of fingers FNG in one block BLK are arbitrary.

In addition, the memory cell array 10 includes a ROM fuse region (not shown). The ROM fuse region is configured from a plurality of memory cells in the memory cell array 10. Parameters of a voltage applied to a bit line BL during, for example, a write operation, are stored in the ROM fuse region.

The row decoder 11 decodes a block address and a page address, selects a word line WL of a corresponding block BLK, and applies an appropriate voltage to the selected word line and non-selected word lines.

The sense amplifier module 12 senses data stored in a memory cell through a bit line BL when reading data, and transfers the write data to the bit line BL when writing data.

The driver 13 generates a voltage necessary for writing, reading, and erasing data, and supplies the voltage to the row decoder 11 and the sense amplifier module 12. The voltage is applied to various types of wirings in the memory cell array 10.

The sequencer 14 controls an entire operation of the semiconductor memory device 1. For example, the sequencer 14 reads a parameter of a voltage to be used during a write operation from the ROM fuse region and stores the parameter in the register 15 in a table when power is turned on for the semiconductor memory device 1.

The register 15 holds various types of signals. The register 15 stores, for example, a status of a write or erase operation of data, thereby notifying an external controller (not shown) as to whether or not the operation has successfully completed. The register 15 may store a command or an address received from the external controller, and may store various tables.

The input/output circuit 16 performs data exchange with the external controller or a host device (not shown). The input/output circuit 16 outputs read data sensed by the sense amplifier module 12 to the outside when reading data, and transfers write data received from the outside to the sense amplifier module 12 when writing data.

[2] Memory Cell Array 10

[2-1] Circuit Configuration

Figure 2:
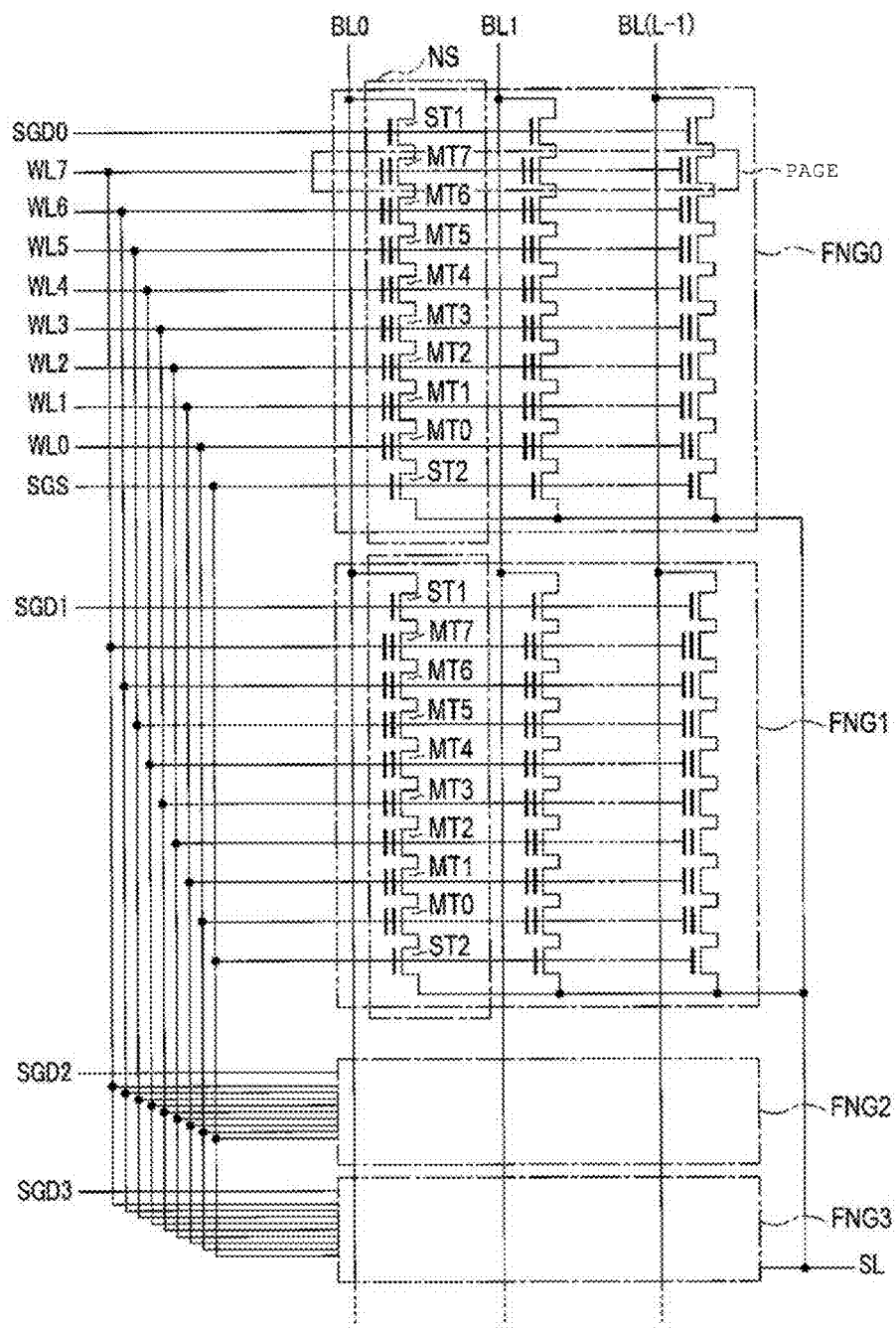
FIG. 2 is a circuit diagram of a memory cell array included in the semiconductor memory device according to the first embodiment.

With reference to FIG. 2, a circuit configuration of one block BLK of the memory cell array 10 included in the semiconductor memory device 1 will be described. The other blocks also have the same configuration.

A block BLK includes, for example, four fingers FNG (FNG0 to FNG3). Each of the fingers FNG includes a plurality of NAND strings NS. Each of the NAND strings NS includes, for example, eight memory cell transistors MT (MT0 to MT7), and select transistors ST1 and ST2. The number of the memory cell transistors MT and the fingers FNG may be set to any number. The number of the memory cell transistors MT may be, for example, 16, 32, 64, or 128.

The memory cell transistor MT includes a control gate and a stacked gate including a charge storage layer to hold the data in a non-volatile manner. The memory cell transistor MT is connected in series between the select transistors ST1 and ST2. One end of the memory cell transistor MT7 is connected to one end of the select transistor ST1, and one end of the memory cell transistor MT0 is connected to one end of the select transistor ST2.

In each of fingers FNG0 to FNG3, the gates of the select transistors ST1 are commonly connected to a corresponding one of select gate lines SGD0 to SGD3, and the gates of the select transistors ST2 are commonly connected to the select gate line SGS that is common across the fingers FNG0 to FNG3. In the same block BLK, control gates of the memory cell transistors MT0 to MT7 are commonly connected to a corresponding one of the word lines WL0 to WL7. That is, in the same block BLK, the word line WL0 to WL7 and the select gate line SGS are commonly connected to each other across the fingers FNG0 to FNG3, and the select gate line SGD is independent for each of the fingers FNG0 to FNG3.

Among NAND strings NS arranged in a matrix shape in the memory cell array 10, the other end of the select transistor ST1 of NAND strings NS in the same row is commonly connected to one bit line BL (BL0 to BL (L−1), where (L−1) is a natural number equal to or more than 1). That is, NAND strings NS in the same row are commonly connected to the bit line BL across a plurality of blocks BLK. The other end of the select transistor ST2 is commonly connected to a source line SL. The source line SL is commonly connected, for example, across the plurality of blocks BLK.

Reading and writing data is collectively performed on a plurality of memory cell transistors MT commonly connected to one word line WL in one finger FNG of one block BLK. A unit to be used in the reading and writing data is defined as a page.

[2-2] Cross-Sectional Structure

Figure 3:
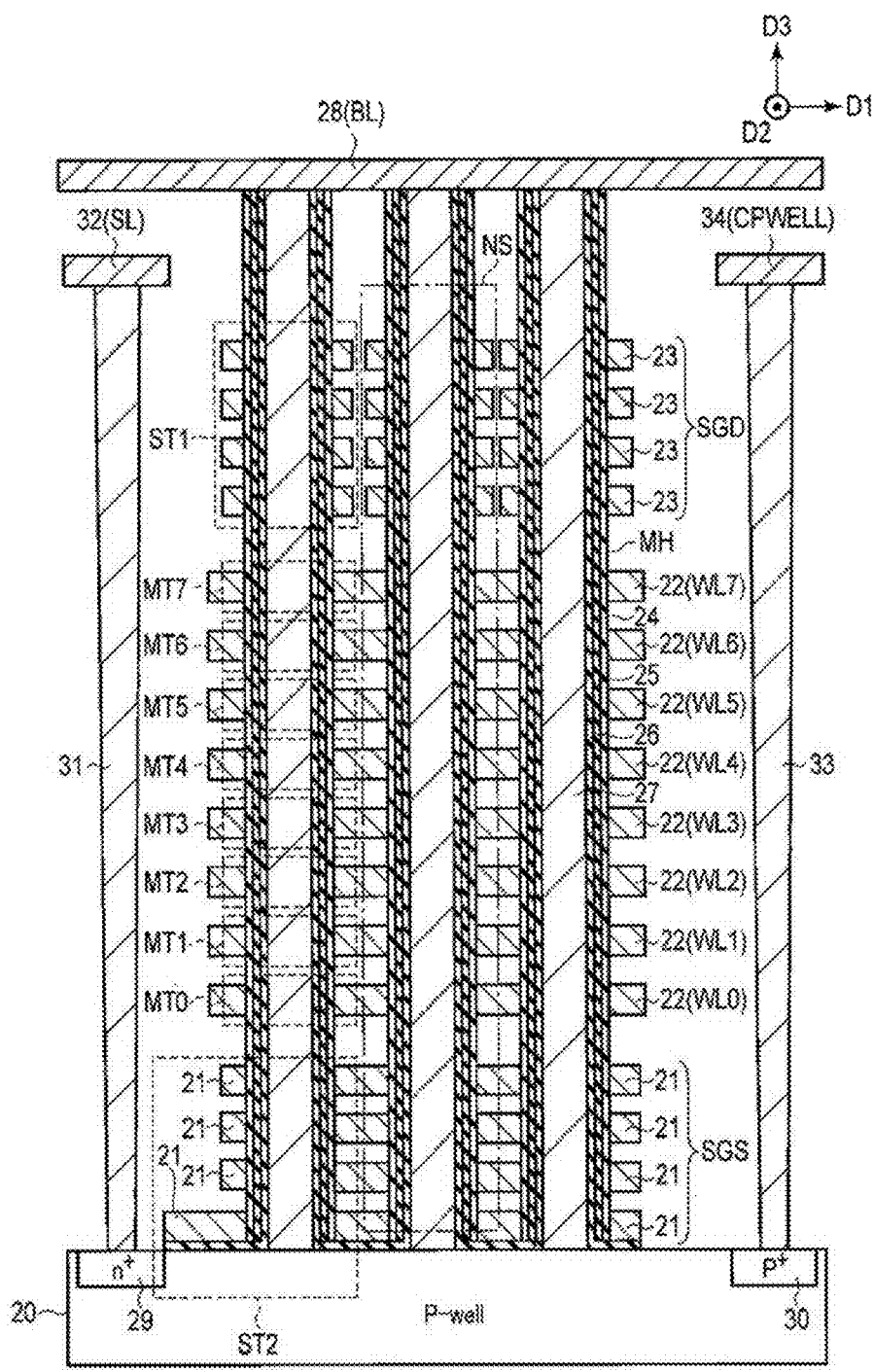
FIG. 3 is a sectional view of the memory cell array included in the semiconductor memory device according to the first embodiment.

With reference to FIG. 3, a cross-sectional structure of the memory cell array 10 included in the semiconductor memory device 1 will be described.

A plurality of NAND strings NS are formed on a p-type well region 20 of the semiconductor memory device 1. Specifically, a plurality of wiring layers 21 functioning as a select gate line SGS, a plurality of wiring layers 22 functioning as a word line WL, and a plurality of wiring layers 23 functioning as a select gate line SGD are formed on the p-type well region 20.

The wiring layer 21 is formed by, for example, four layers, and is electrically connected to a common select gate line SGS using the plurality of NAND strings NS, to function as the gate electrodes of two select transistor ST2.

The wiring layer 22 is formed by, for example, eight layers, and is electrically connected to a common word line WL in each layer.

The wiring layer 23 is formed by, for example, four layers, and is connected to a corresponding select gate line SGD in each NAND string NS, to function as the gate electrode of one select transistor ST1.

A memory hole MH is formed through the wiring layers 21, 22, and 23 to reach the p-type well region 20. A block insulation film 24, a charge storage layer 25 (insulation film), and a gate insulation film 26 are sequentially formed on a side surface of the memory hole MH. A conductive film (semiconductor pillar) 27 is embedded in the memory hole MH. The semiconductor pillar 27 functions as a current path of the NAND strings NS. A wiring layer 28 which functions as the bit line BL is formed on an upper end of the semiconductor pillar 27.

In this manner, the select transistor ST2, the plurality of memory cell transistors MT, and the select transistor ST1 are sequentially stacked on the p-type well region 20, and one memory hole MH corresponds to one NAND string NS.

An $n^+$-type impurity diffusion layer 29 and a $p^+$-type impurity diffusion layer 30 are formed in a surface of the p-type well region 20.

A contact plug 31 is formed on the $n^+$-type impurity diffusion layer 29 and a wiring layer 32 which functions as a source line SL is formed on the contact plug 31. The source line SL is electrically connected to the driver 13.

A contact plug 33 is formed on the $p^+$-type impurity diffusion layer 30, and a wiring layer 34 which functions as a well wiring CPWELL is formed on the contact plug 33. The well wiring CPWELL is electrically connected to the driver 13.

The contact plugs 31 and 33 are formed in a planar shape in a depth direction.

A layer on which the wiring layers 32 and 34 are formed is above the wiring layer 23 (select gate line SGD) and below the layer on which the wiring layer 28 is formed.

Configurations above are arranged in a plural manner in a depth direction of a paper illustrating FIG. 3. One finger FNG includes a set of the plurality of NAND strings NS arranged in a column in the depth direction.

Furthermore, the wiring layers 21 function as a common select gate line SGS and are electrically connected to each other in the same block BLK. The gate insulation film 26 is formed between the lowest layer of wiring layer 21 and the p-type well region 20. The lowest layer of wiring layer 21 and the gate insulation film 26 are formed up to an edge of the $n^+$-type impurity diffusion layer 29.

Accordingly, when the select transistor ST2 is turned on, a channel which is formed electrically connects a memory cell transistor MT0 and the $n^+$-type impurity diffusion layer 29. The driver 13 applies a voltage to the well wiring CPWELL, and thereby it is possible to give a potential to the semiconductor pillar 27.

The memory cell array 10 may have other configurations, for example, the configuration of the memory cell array described in U.S. patent application Ser. No. 12/407,403, filed on Mar. 19, 2009, entitled "three-dimensional stacked non-volatile semiconductor memory," U.S. patent application Ser. No. 12/406,524, filed on Mar. 18, 2009, entitled "three-dimensional stacked non-volatile semiconductor memory," U.S. patent application Ser. No. 12/679,991, filed on Mar. 25, 2010, entitled "Non-volatile semiconductor memory device and manufacturing method thereof," and U.S. patent application Ser. No. 12/532,030, filed on Mar. 23, 2009, entitled "Semiconductor memory and manufacturing method thereof." The entire contents of these patent applications are incorporated by reference herein.

[2-3] Semiconductor Pillar 27

Figure 4:
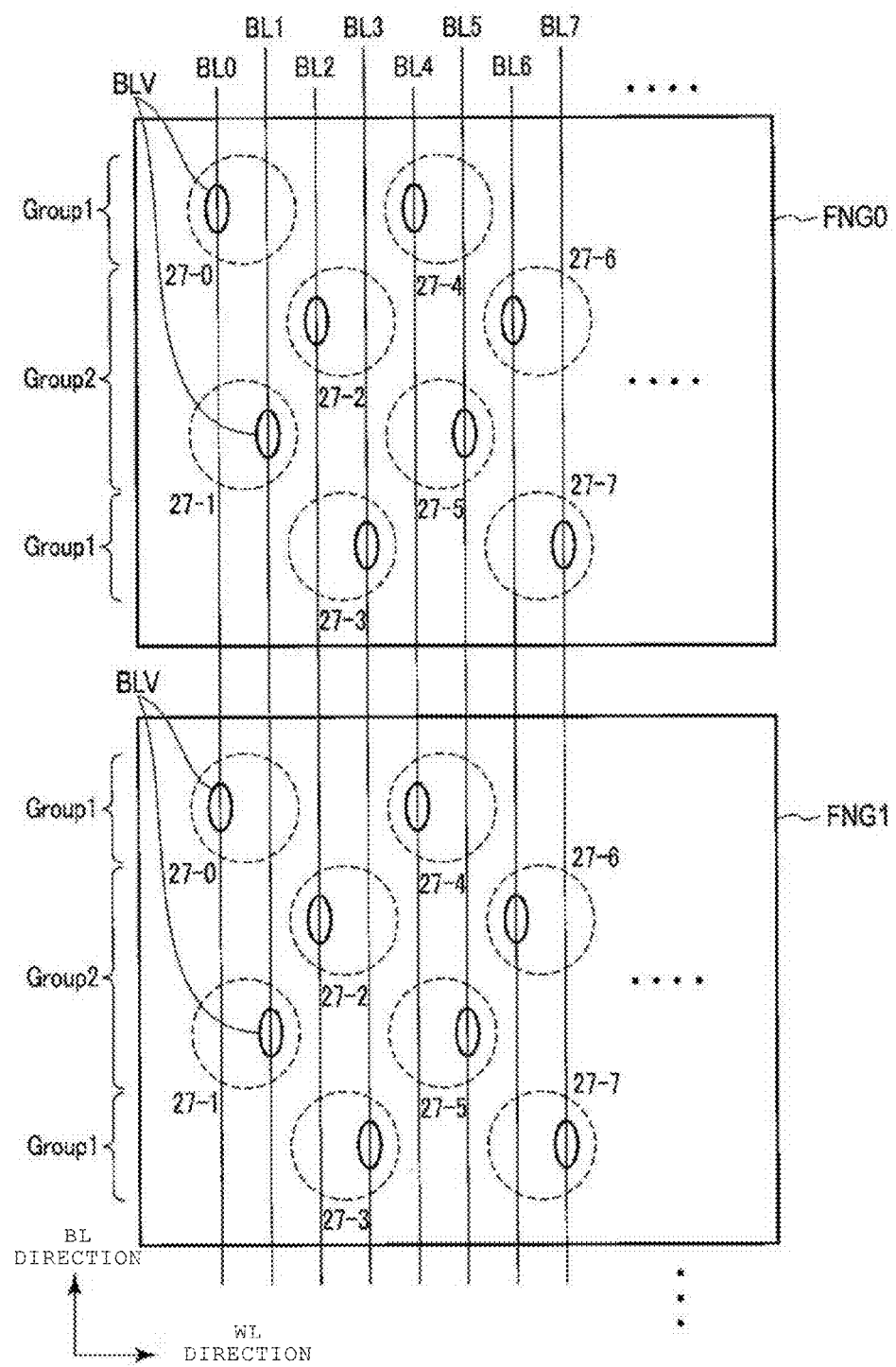
FIG. 4 is a plan view of a semiconductor pillar and a bit line included in the semiconductor memory device according to the first embodiment.

With reference to FIG. 4, a configuration of a semiconductor pillar 27 in a block of the memory cell array 10 included in the semiconductor memory device 1 will be described. For convenience of description, two fingers FNG (FNG0 and FNG1) are shown in FIG. 4. The contact plugs 31 and 33 (not shown) are arranged between adjacent fingers FNG in a bit line direction BL. In addition, other fingers have the same configuration as fingers FNG0 and FNG1.

In each finger FNG, the semiconductor pillars 27 are arranged in a zigzag pattern on planes defined by the word line WL direction and the bit line BL direction. The semiconductor pillars 27-0 to 27-7 connected to the bit lines BL0 to BL7, respectively, are shown in the fingers FNG0 and FNG1. The number of the semiconductor pillars 27 is not limited to eight. Moreover, an arrangement of the semiconductor pillars 27 may be in a matrix configuration.

For example, two bit lines BL are provided above each of the semiconductor pillars 27. One of the semiconductor pillars 27 is electrically connected to one of the two bit lines BL through a bit line contact BLV.

The plurality of semiconductor pillars 27 are classified into two groups (groups 1 and 2) for each finger FNG. In each finger FNG, the semiconductor pillars 27 of Group 1 are arranged (arranged at an end section of the finger FNG in a BL direction) in close proximity to one of the contact plugs 31 and 33, and the semiconductor pillars 27 of Group 2 are interposed between the semiconductor pillars 27 of Group 1 (arranged at a center section of the finger FNG in the BL direction).

Figure 6:
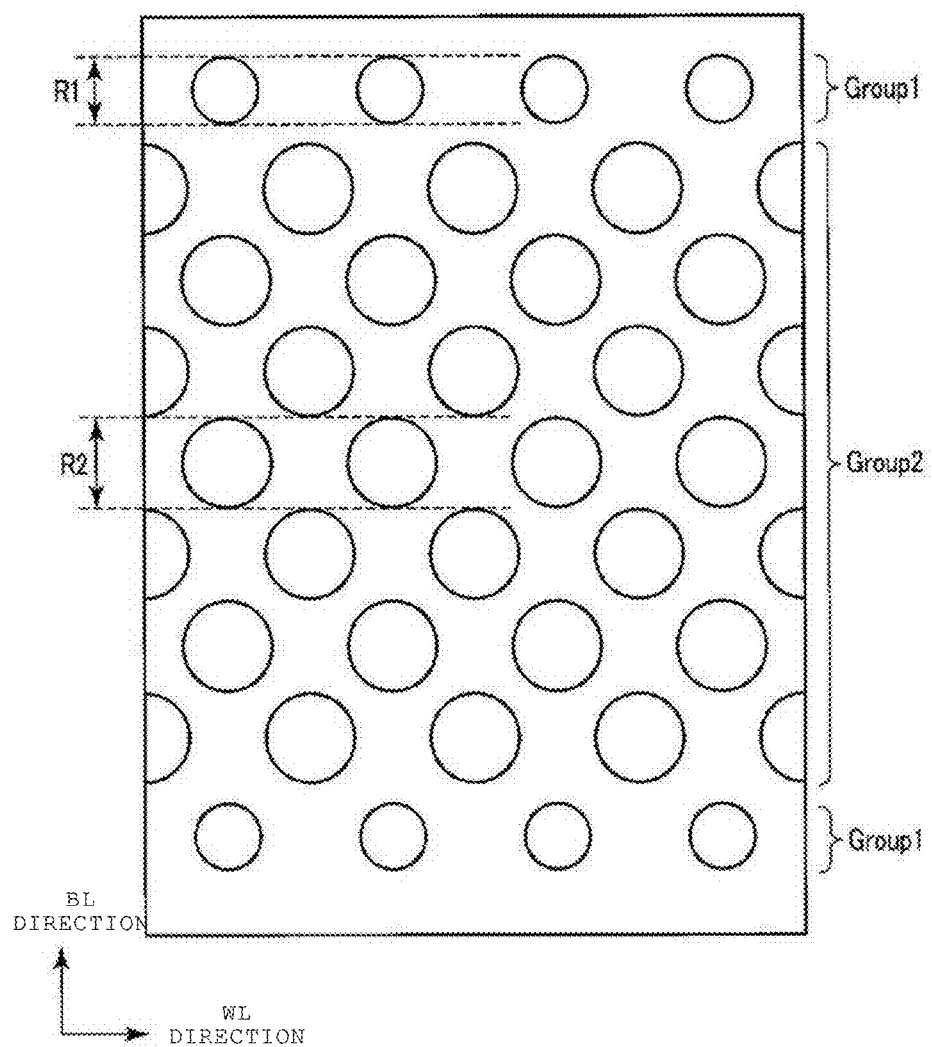
FIG. 6 is a plan view of the semiconductor pillar included in the semiconductor memory device according to the first embodiment.

Specifically, semiconductor pillars 27-0, 27-3, 27-4, and 27-7 are included in Group 1, and semiconductor pillars 27-1, 27-2, 27-5, and 27-6 are included in Group 2. That is, bit lines BL0, BL3, BL4, and BL7 are connected to the semiconductor pillars 27 of Group 1, and bit lines BL1, BL2, BL5, and BL6 are connected to the semiconductor pillars 27 of Group 2. In this manner, a plurality of bit lines BL connected to the semiconductor pillars 27 of Group 1 alternate with a plurality of bit lines BL connected to the semiconductor pillars 27 of Group 2 in the WL direction two by two. Moreover, when the semiconductor pillars 27 are arranged in the zigzag pattern shown in FIG. 6, the plurality of bit lines BL connected to the semiconductor pillars 27 of Group 1 alternate with the plurality of bit lines BL connected to the semiconductor pillars 27 of Group 2 in the WL direction four by four.

Figure 5:
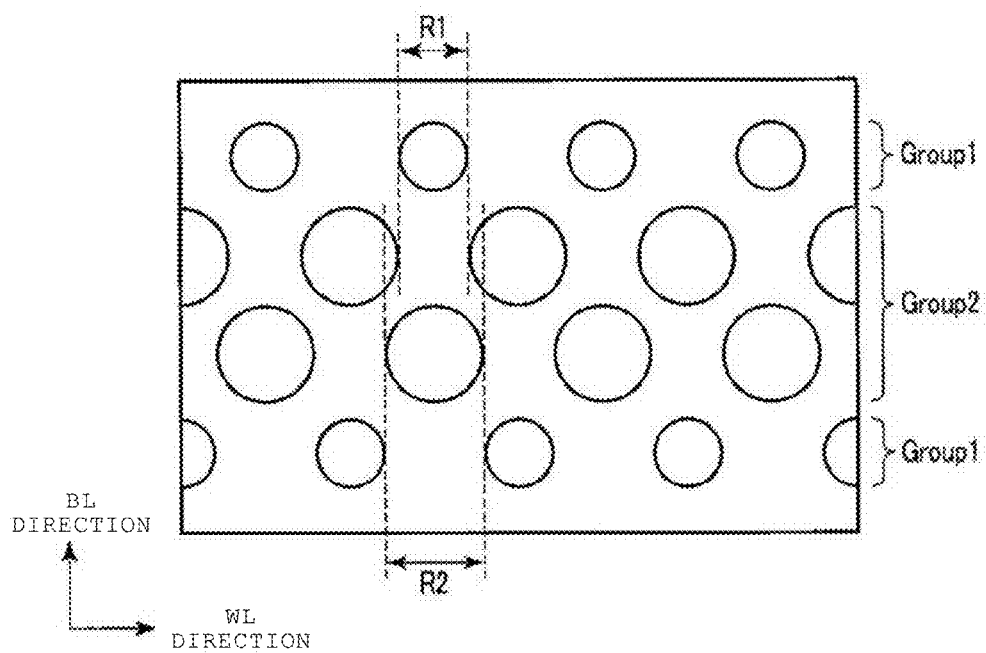
FIG. 5 is a plan view of the semiconductor pillar included in the semiconductor memory device according to the first embodiment.

FIG. 5 depicts an actual diameter of the semiconductor pillar 27. As shown in FIG. 5, the diameter R1 of the semiconductor pillar 27 of Group 1 is smaller than the diameter R2 of the semiconductor pillar 27 of Group 2. The diameter of the semiconductor pillar 27 of a circular cross section is defined herein as a length of a chord passing through a center thereof, and the diameter of the semiconductor pillar 27 of an elliptical cross section is defined herein as (major diameter+minor diameter)/2. In addition, even when the arrangement of the semiconductor pillars 27 is in the zigzag pattern (for example, in the zigzag pattern shown in FIG. 6), the diameter R1 of the semiconductor pillars 27 of Group 1 is smaller than the diameter R2 of the semiconductor pillars 27 of Group 2 in the same manner.

[3] Sense Amplifier Module 12

[3-1] Configuration

Figure 7:
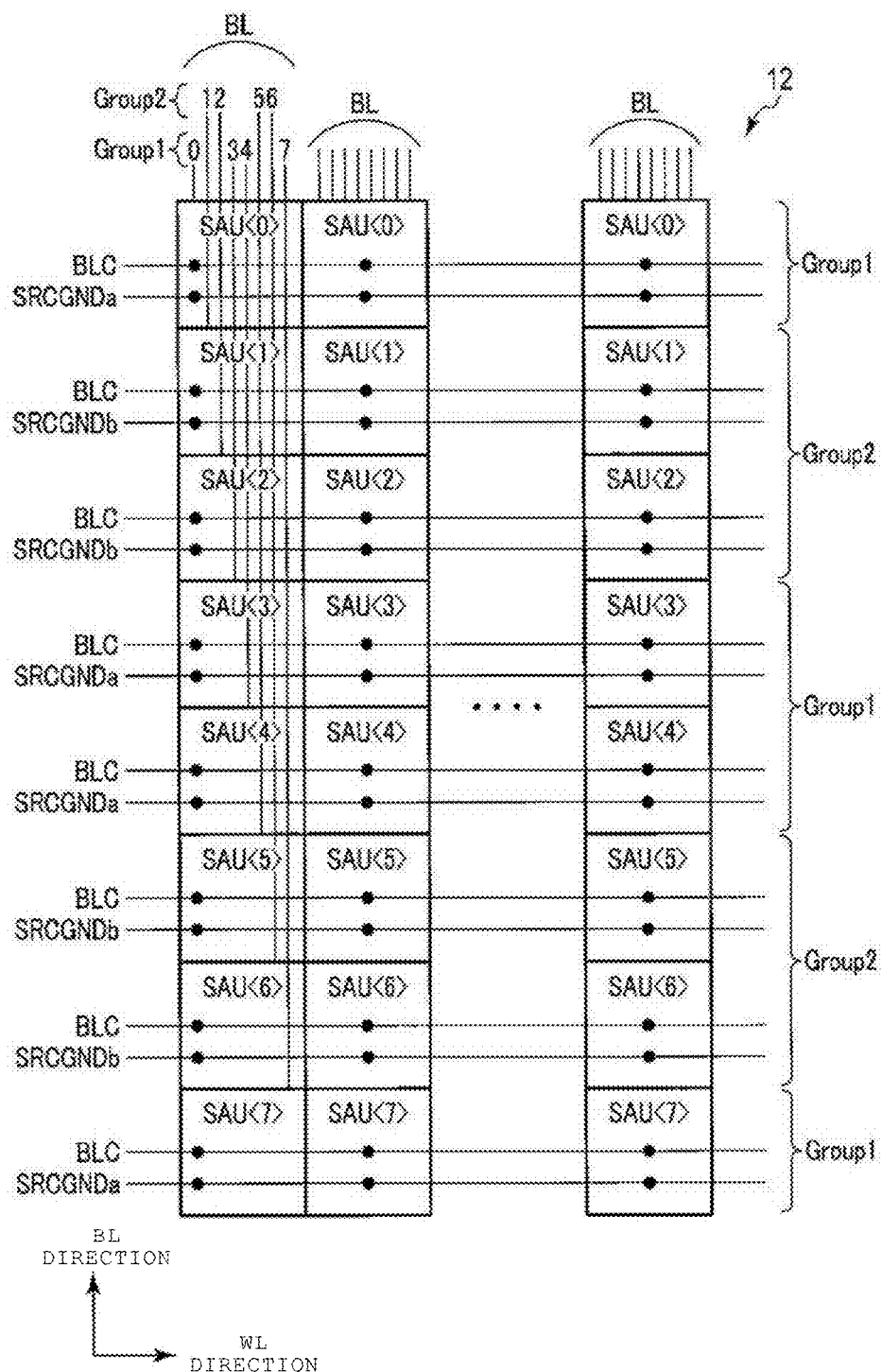
FIG. 7 is a block diagram of a sense amplifier included in the semiconductor memory device according to the first embodiment.

A configuration of the sense amplifier module 12 included in the semiconductor memory device 1 will be described using FIG. 7.

The sense amplifier module 12 includes a plurality of sense amplifier units SAU. The sense amplifier units SAU are each provided for one bit line. As an arrangement of the sense amplifier units SAU, for example, eight sense amplifier units SAU<0> to SAU<7> are arranged in a column in the bit line BL direction.

Bit lines BL0, BL3, BL4, and BL7 (the bit lines BL connected to the semiconductor pillars 27 of Group 1) are connected to sense amplifier units SAU<0>, SAU<3>, SAU<4>, and SAU<7>, respectively. Bit lines BL1, BL2, BL5, and BL6 (the bit lines BL connected to the semiconductor pillars 27 of Group 2) are connected to sense amplifier units SAU<1>, SAU<2>, SAU<5>, and SAU<6>, respectively.

For simplicity, in the following description, bit lines BL and sense amplifier units SAU corresponding to the semiconductor pillars 27 of Groups 1 and 2 are described as bit lines BL and sense amplifier units SAU of Groups 1 and 2, respectively.

The eight sense amplifier units SAU<0> to SAU<7> are arranged in a plural manner in the word line WL direction. A wiring that supplies a control signal BLC to each of the sense amplifier units SAU is connected to the sense amplifier units. Nodes SRCGNDa and SRCGNDb are connected to the sense amplifier units SAU of Groups 1 and 2.

[3-2] Circuit configuration

A circuit configuration of the sense amplifier unit SAU included in the semiconductor memory device 1 will be described with reference to FIG. 8.

The sense amplifier unit SAU includes a sense amplifier SA and a latch circuit SDL. The sense amplifier SA applies a voltage to the bit line BL according to data held by the latch circuit SDL. The latch circuit SDL holds write data received from the input/output circuit 16. When each memory cell transistor MT holds data of two bits or more, two or more latch circuits are provided.

The sense amplifier SA includes a high breakdown voltage n-channel MOS transistor 40, low breakdown voltage n-channel MOS transistors 41 to 48, a low breakdown voltage p-channel MOS transistor 49, and a capacitor element 50.

When a control signal BLS is applied to its gate, one end of the transistor 40 is connected to a corresponding bit line BL. The transistor 41 has one end connected to the other end of the transistor 40, and the other end connected to a node SCOM, and a control signal BLC is input to a gate of the transistor 41. The transistor 41 is intended to clamp a corresponding bit line BL to a potential according to the control signal BLC.

A transistor 45 has one end connected to a node SCOM, the other end connected to a node SRCGND (node SRCGNDa or SRCGNDb), and a gate connected to a node INV_S. The transistor 42 has one end connected to the node SCOM, the other end connected to a node SSRC, and a control signal BLX is input to a gate of the transistor 42. A transistor 49 has one end connected to the node SSRC, the other end supplied a voltage VDDSA (power supply voltage, for example, 2.5 V), and a gate connected to a node INV_S. The transistor 43 has one end connected to the node SCOM, the other end connected to a node SEN, and a control signal XXL is input to a gate of the transistor 43. The transistor 44 has one end connected to the node SSRC, the other end connected to a node SEN, and a control signal HLL is input to a gate of the transistor 44.

A transistor 47 includes one end grounded and the gate connected to the node SEN. A transistor 48 includes one end connected to the other end of the transistor 47, the other end connected to a bus LBUS, and a control signal STB is input to a gate of the transistor 48. The transistor 46 includes one end connected to the node SEN, the other end connected to the bus LBUS, and a control signal BLQ is input to a gate of the transistor 46. A capacitor element 50 includes one electrode connected to the node SEN, and a clock CLK is input to the other electrode of the capacitor element 50.

[4] Operations

Figure 9:
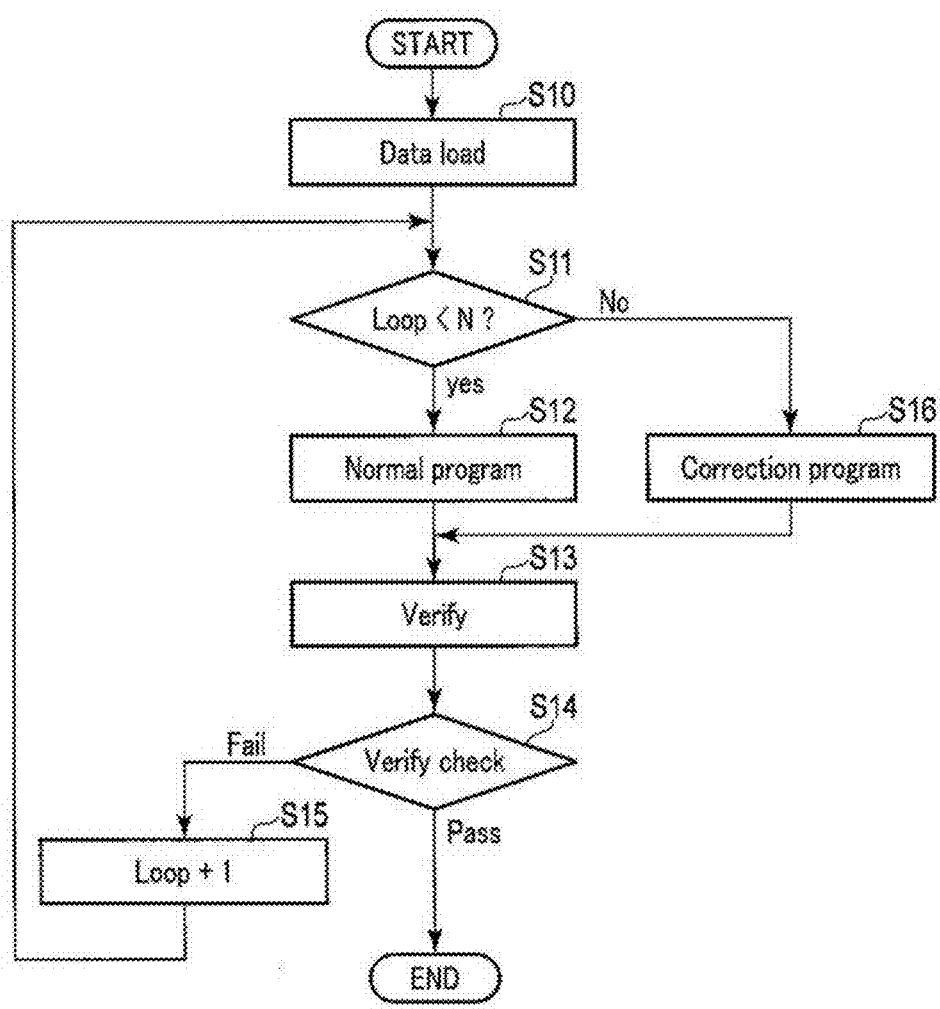
FIG. 9 is a flow chart of a write operation of the semiconductor memory device according to the first embodiment.

With reference to FIG. 9, a flow of the write operation of the semiconductor memory device 1 will be described. In a following description, a memory cell transistor MT (memory cell) to be written, to which a selected word line WL is connected, is regarded as a selected memory cell, and a memory cell not be written, to which a non-selected word line WL is connected, is regarded as a non-selected memory cell.

First, the sequencer 14 loads write data received from the outside onto a latch circuit SDL of the sense amplifier module 12 through the input/output circuit 16 (Step S10).

Next, the sequencer 14 determines whether or not the number of write loops is less than N times (N is a natural number of 1 or more) (Step S11). The number of write loops indicates the number of times a write operation is repeated.

Then, when the number of write loops is less than N times, the sequencer 14 performs a normal write operation (Step S12). Details of the normal write operation (Normal program) and a correction write operation (Correction program, Step S16 to be described later) will be described later.

Then, the sequencer 14 performs a verification operation which checks the threshold voltage of the selected memory cell. In the verification operation, the sequencer 14 determines whether or not a threshold voltage of a memory cell to be written reaches a target level (a threshold voltage representing completion of writing of the memory cell) (Step S13).

Then, the sequencer 14 determines whether or not verification is passed (Step S14). For example, when the number of memory cells whose threshold voltages are determined to be less than the target level in the verification operation is less than a predetermined number, this is referred to as verification passed. In a case of verification failure, the sequencer 14 increments the number of write loops (Step S15). The sequencer 14 returns to Step S11 and repeats the write loop (i.e., the write operation and the verification operation).

When the number of write loops reaches a maximum value, the sequencer 14 may determines the write operation fails and end the write operation.

In Step S11, when the number of write loops is equal to or more than N times, the sequencer 14 performs the correction write operation (Step S16), and then performs the verification operation in Step S13.

Figure 10:
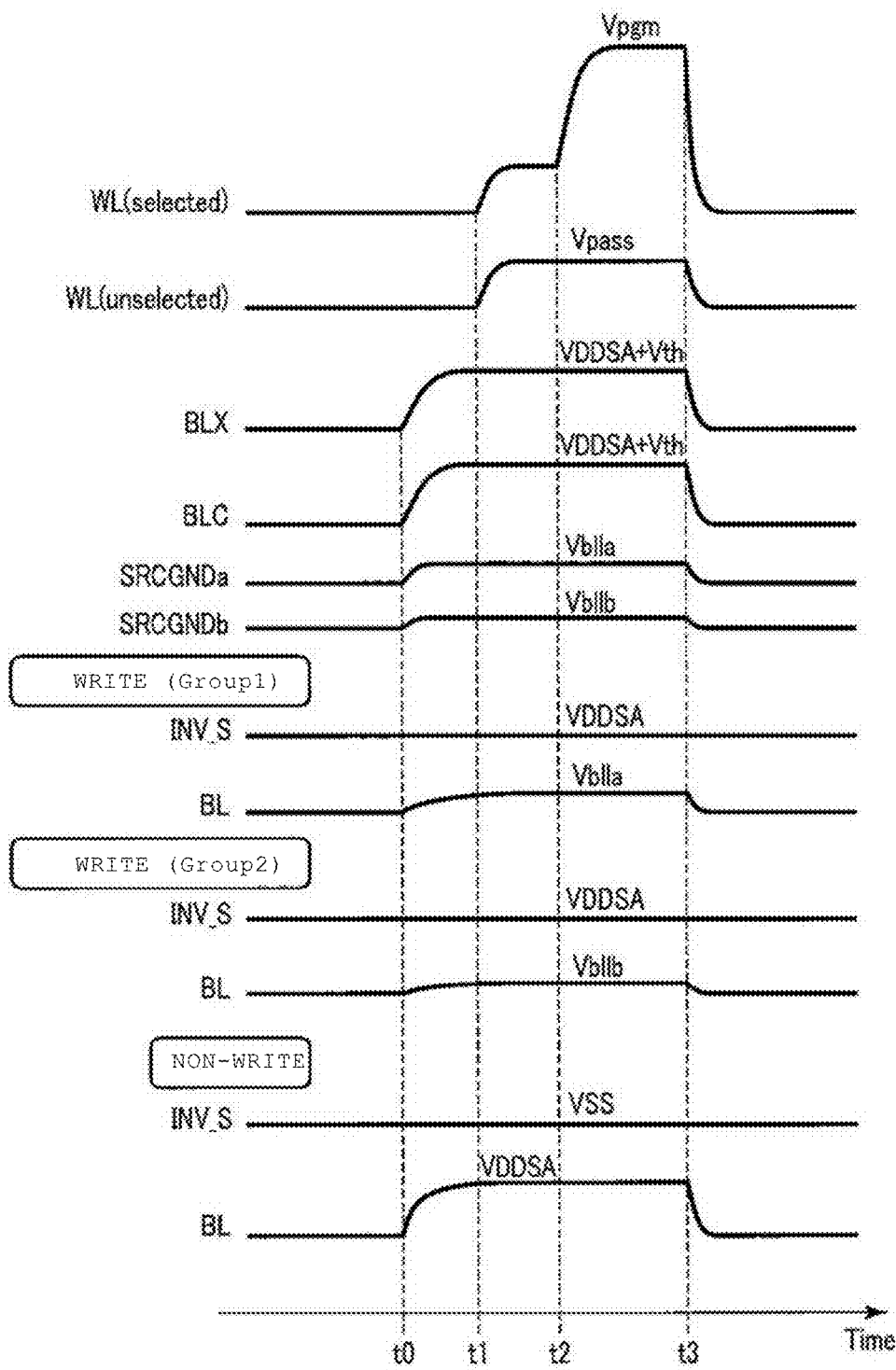
FIG. 10 is a write operation timing diagram of the semiconductor memory device according to the first embodiment.

Then, with reference to FIGS. 8 and 10, details of the normal write operation and the correction write operation will be described. First, the correction write operation will be described.

The sequencer 14 sets voltages of control signals BLX and BLC to VDDSA+Vth, and sets the transistors 41 and 42 in an ON state (time t0). Vth is a threshold voltage of the transistors 41 and 42. In addition, the sequencer 14 sets voltages of SRCGNDa and SRCGNDb to Vbl1a and Vbl1b, respectively. Values of the voltages Vbl1a and Vbl1b are set based on a parameter stored in the register 15. A relationship between the voltages Vbl1a, Vbl1b, and VDDSA is VDDSA>Vbl1a>Vbl1b, and Vbl1b is, for example, a voltage VSS (=0 V).

When writing "0" data into a memory cell (a case of increasing a threshold by injecting electric charges into the charge storage layer), the node INV_S of the latch circuit SDL becomes an "H" level (voltage VDDSA), and the transistor 45 is turned on. Accordingly, the voltages Vbl1a and Vbl1b are applied to the bit lines BL of Groups 1 and 2 from the node SRCGNDa and SRCGNDb, respectively.

On the other hand, when writing "1" data into the memory cell (a case of holding a threshold without injecting electric charges into the charge storage layer), the node INV_S of the latch circuit SDL becomes an "L" level (voltage VSS=0 V), and the transistor 49 is turned on. Accordingly, a voltage VDDSA is applied to the bit line BL.

In the following description, a bit line BL connected to a memory cell into which the "0" data is written is set to be a first bit line BL, and a bit lie BL connected to a memory cell into which the "1" data is written is set to be a second bit line BL.

Next, the sequencer 14 turns on the select transistor ST1 of a finger FNG including a selected memory cell and turns off the select transistor ST1 of a finger FNG not including the selected memory cell in a selected block. In addition, the sequencer 14 turns off the select transistor ST2 in a selected block. The sequencer 14 turns off the select transistors ST1 and ST2 in a non-selected block. In addition, the sequencer 14 sets a voltage of the selected and non-selected word lines to be Vpass (for example, 10 V) (time t1). The Vpass is a voltage for suppressing injection of electrons into the charge storage layer by turning on a memory cell regardless of data held and increasing a voltage of a channel by coupling.

Next, the sequencer 14 sets a voltage of the selected word line WL to be a program voltage Vpgm (for example, 20 V) (time t2). The program voltage Vpgm is stepped up whenever the number of write loops is increased.

A high voltage of (Vpgm-Vbl1a) is applied between a gate and a channel of the selected memory cell to which the first bit line BL of Group 1 is connected, and data are written into the selected memory cell in a selected block. In addition, a high voltage of (Vpgm-Vbl1b) is applied between the gate and the channel of the selected memory cell to which the first bit line BL of Group 2 is connected, and data are written into the selected memory cell. Here, since Vbl1a is higher than Vbl1b, a selected memory cell connected to the first bit line BL of Group 1 has an amount of write (charge injection amount) less than that of a selected memory cell connected to the first bit line BL of Group 2. The select transistors ST1 and ST2 are cut off in NAND strings connected to the second bit line BL, and a channel region is in a floating state. Accordingly, a potential of a channel may be boosted (the potential of a channel at this time is higher than a voltage VDDSA) by coupling with a word line. Accordingly, a high electric field is not applied to a tunnel oxide film, and data is not written into the memory cell.

In NAND strings of a non-selected block, the select transistors ST1 and ST2 are cut off (SGD=0 V, SGS=0 V), the channel region is in a floating state. Accordingly, the potential of a channel is boosted by the coupling with a word line. Accordingly, the high electric field is not applied to a tunnel oxide film, and data is not written in a memory cell of a non-selected block.

As described above, one time correction write operation is completed (time t3). The correction write operation is performed from an $N^{th}$ write loop. The correction write operation may be performed from, for example, a first write loop, and may be performed from any write loop number.

Then, the normal write operation will be described. In the normal write operation, a voltage applied to the node SRCGNDa at time t0 is set to be Vbl1b. That is, a high voltage of (Vpgm-Vbl1b) is applied between the gate and the channel of the selected memory cell connected to the first bit line, and data are written into the selected memory cell. The other operations of the normal write operation are the same as the correction write operation.

[5] Effects of First Embodiment

The semiconductor memory device 1 according to the first embodiment changes a voltage applied to the first bit line during a write operation according to a diameter (disposition of the semiconductor pillar 27) of the semiconductor pillar 27. Specifically, the voltage Vblla is applied to the first bit line BL connected to the semiconductor pillar 27 (Group 1 of FIG. 5) whose diameter is small, through the node SRCGNDa during the write operation. On the other hand, the voltage Vbllb lower than the voltage Vblla is applied to the first bit line BL connected to the semiconductor pillar 27 (Group 2 of FIG. 5) whose diameter is large, through the node SRCGNDb (correction write operation).

Accordingly, the memory cell connected to the first bit line BL of Group 1 has a small electric field applied between the gate and the channel thereof, and write speed is decreased. As a result, it is possible to make the write speed of a memory cell having a small diameter of the semiconductor pillar 27 the same as that of a memory cell having a large diameter of the semiconductor pillar 27. Accordingly, variations in the write speed in the same page is reduced, such that it is possible to reduce unnecessary program disturbance. In addition, variations in a threshold voltage of a memory cell may be reduced by reducing the variations in the write speed, such that it is possible to narrow the width of threshold voltage distribution of the memory cell.

In addition, the semiconductor memory device 1 has a change in the write speed of a memory cell according to an increase in the number of write loops in some cases. There, the correction write operation may be applied from the $n^{th}$ write loop in the semiconductor memory device 1. Accordingly, the same effects as described above may be obtained.

Figure 11:
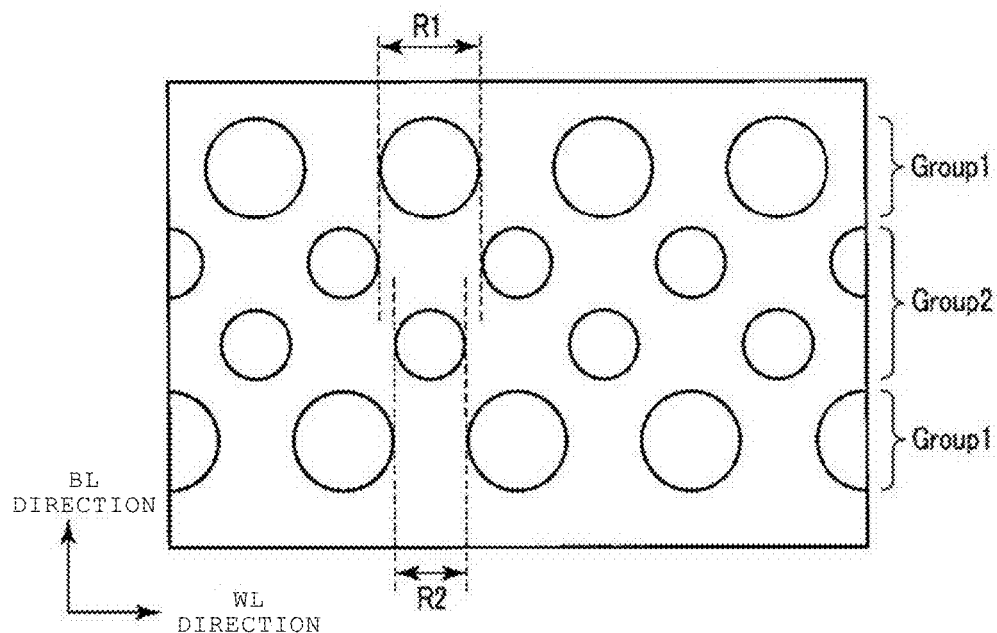
FIG. 11 is a plan view of a modified semiconductor pillar included in the semiconductor memory device according to the first embodiment.

As shown in FIG. 11, the diameter R1 of the semiconductor pillars 27 of Group 1 is larger than the diameter R2 of the semiconductor pillars 27 of Group 2 in some cases. In this case, the voltage Vbllb may be applied to the first bit lines BL of Group 1 through the node SRCGNDa, and the voltage Vblla may be applied to the first bit line of Group 2 through the node SRCGNDb during the write operation. Accordingly, the same effects as described above may be obtained.

Figure 12:
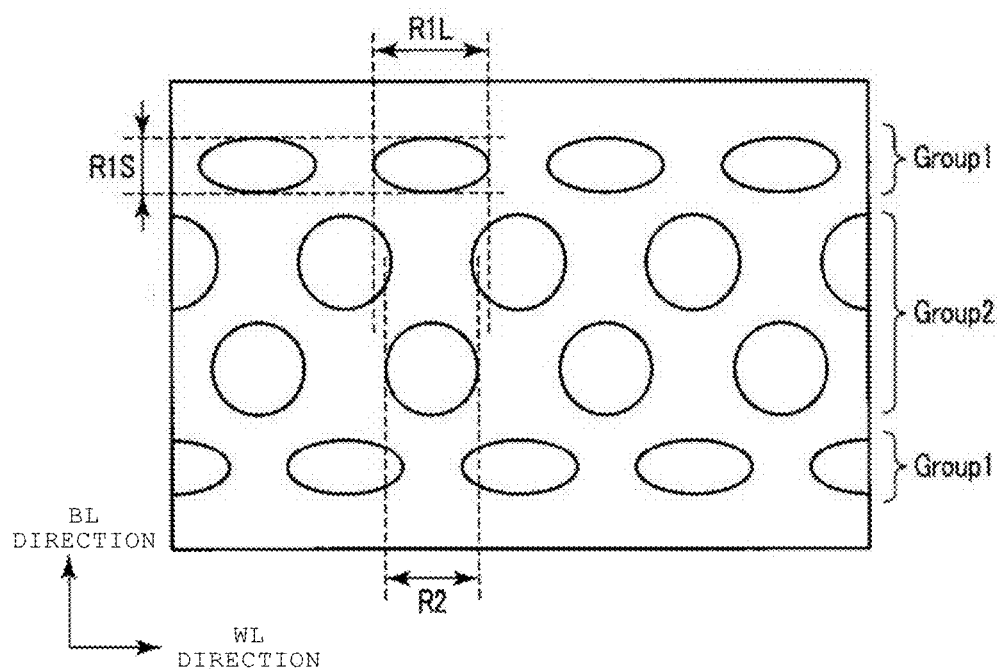
FIG. 12 is a plan view of a modified semiconductor pillar included in the semiconductor memory device according to the first embodiment.

In addition, as shown in FIG. 12, the semiconductor pillars 27 of Group 1 and the semiconductor pillars 27 of Group 2 may have different shapes (when the semiconductor pillars 27 of Group 1 are of an ellipse) in some cases. "Ellipse" herein shows that, when a long diameter of the semiconductor pillar 27 of Group 1 is R1L, and a short diameter thereof is R1S, the long diameter R1L being greater than a diameter R2, and the short diameter R1S being smaller than the diameter R2.

When the semiconductor pillars 27 have different shapes, there is a difference in the write speed of a memory cell in some cases even when the semiconductor pillars 27 have the same diameter. Likewise, in this case, the voltage Vblla is applied to the first bit line BL of Group 1 through the node SRCGNDa, and the voltage Vbllb is applied to the first bit line of Group 2 through the node SRCGNDb during the write operation, and thereby the same effects as described above may be obtained.

Second Embodiment

Figure 13:
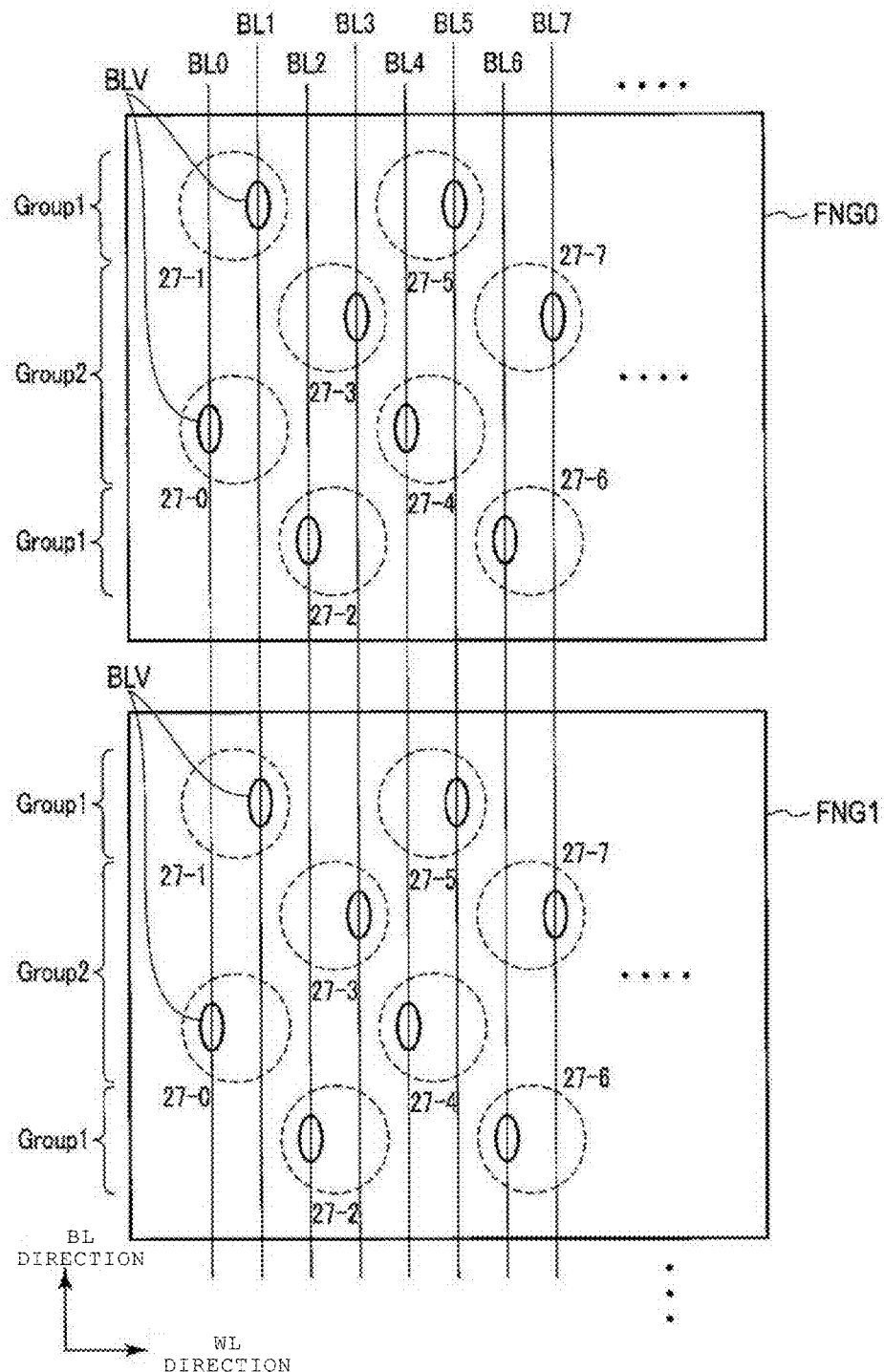
FIG. 13 is a plan view of a semiconductor pillar and a bit line included in a semiconductor memory device according to a second embodiment.

A semiconductor memory device 1 according to a second embodiment has a different arrangement of the semiconductor pillars 27 connected to the bit line BL. With reference to FIG. 13, a configuration of the semiconductor pillars 27 in a block of the memory cell array 10 included in the semiconductor memory device 1 will be described.

As shown in FIG. 13, semiconductor pillars 27-0, 27-3, 27-4, and 27-7 are included in Group 2, and semiconductor pillars 27-1, 27-2, 27-5, and 27-6 are included in Group 1. That is, bit lines BL0, BL3, BL4, and BL7 are connected to the semiconductor pillars 27 of Group 2, and bit lines BL1, BL2, BL5, and BL6 are connected to the semiconductor pillars 27 of Group 1. The other configurations are the same as in the first embodiment. An operation of the semiconductor memory device 1 according to the second embodiment is the same as in the first embodiment.

In the above configuration, the semiconductor memory device 1 according to the second embodiment may obtain the same effects as in the first embodiment.

Third Embodiment

Figure 14:
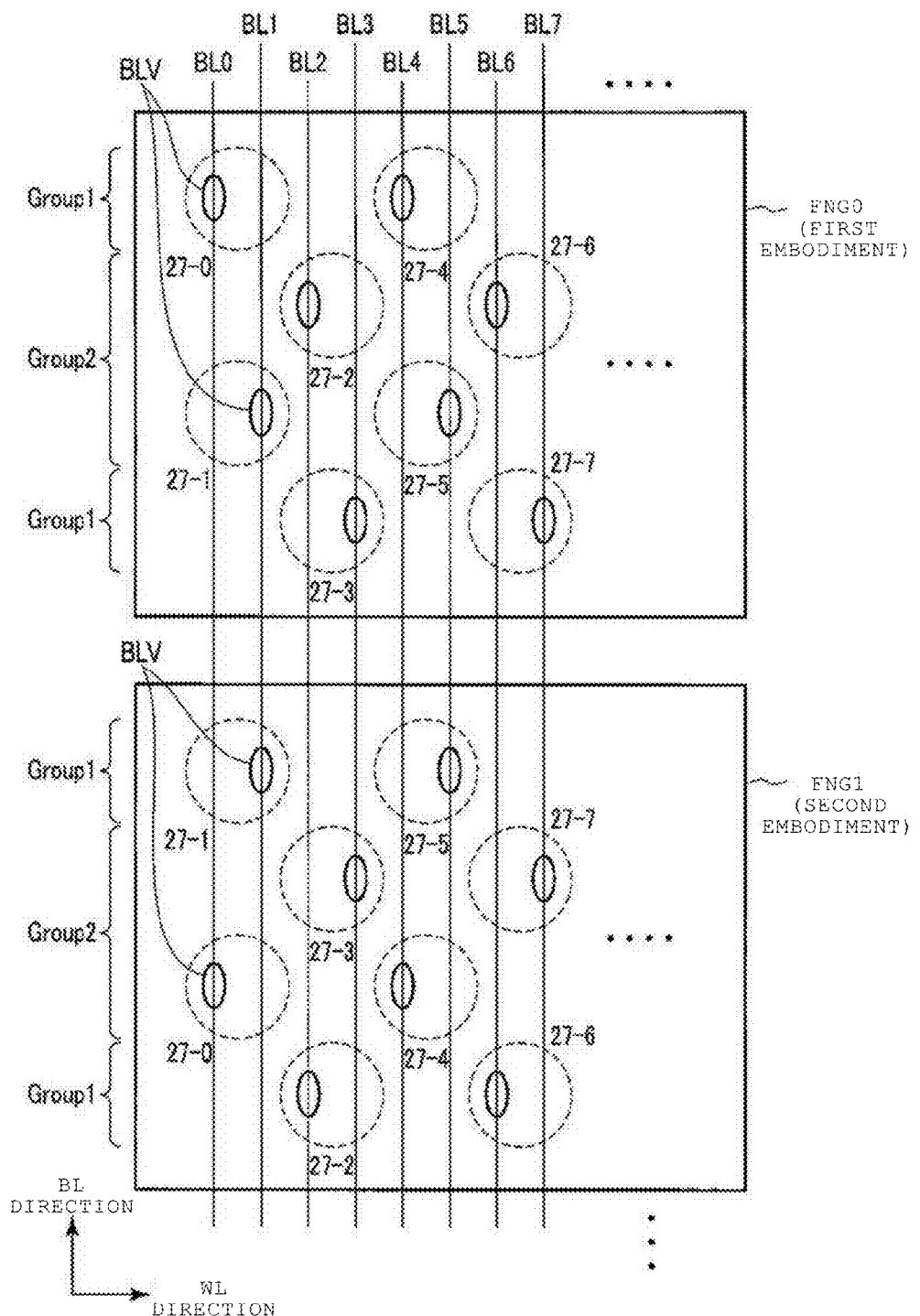
FIG. 14 is a plan view of a semiconductor pillar and a bit line included in a semiconductor memory device according to a third embodiment.

A semiconductor memory device 1 according to a third embodiment has fingers FNG of the first and the second embodiments alternately arranged. With reference to FIG. 14, a configuration of the semiconductor pillars 27 in a block of the memory cell array 10 included in the semiconductor memory device 1 will be described.

In a finger FNG0, the semiconductor pillars 27 have the same configuration as in the first embodiment. In a finger FNG1, the semiconductor pillars 27 have the same configuration as in the second embodiment. After finger FNG1, configurations of the fingers FNG0 and FNG1 are repeated so that even fingers FNG2, FNG4, etc. have the configuration of finger FNG0 and odd fingers FNG3, FNG5, etc. have the configuration of finger FNG1.

Accordingly, the bit lines BL0, BL3, BL4, and BL7 are connected to the semiconductor pillars 27 of Group 1 in the finger FNG0 (even numbered finger FNG), and are connected to the semiconductor pillars 27 of Group 2 in the finger FNG1 (odd numbered finger FNG). On the other hand, the bit lines BL1, BL2, BL5, and BL6 are connected to the semiconductor pillars 27 of Group 2 in the finger FNG0 (even numbered finger FNG), and are connected to the semiconductor pillars 27 of Group 1 in the finger FNG1 (odd numbered finger FNG).

In the semiconductor memory device 1 according to the third embodiment, the voltage Vblla is applied to the first bit line BL of Group 1 through the node SRCGNDa and the voltage Vbllb is applied to the first bit line of Group 2 through the node SRCGNDb during a write operation of the even numbered finger FNG. On the other hand, the voltage Vblla is applied to the first bit line BL of Group 1 through the node SRCGNDb and the voltage Vbllb is applied to the first bit line of Group 2 through the node SRCGNDa during a write operation of odd numbered finger FNG. The other operations are the same as in the first embodiment.

With the above configurations, the semiconductor memory device 1 according to the third embodiment may obtain the same effects as in the first embodiment.

Fourth Embodiment

A semiconductor memory device 1 according to a fourth embodiment uses a Quick Pass Write (QPW) method when writing data. The QPW method is described in U.S. patent application Ser. No. 14/263,948, filed on Apr. 28, 2014, entitled "Non-volatile semiconductor memory device," and the entire contents of this patent application is incorporated by reference herein.

The QPW method will be described. When a threshold voltage of a memory cell is a first level or more, a write operation using a voltage Vqpw is performed. The voltage Vqpw is higher than the voltages Vblla and Vbllb, and is lower than the voltage VDDSA. When the threshold voltage of a memory cell is a second level or more (the first level<the second level), verification of the memory cell is passed and the memory cell is locked out in subsequent write operations.

Figure 8:
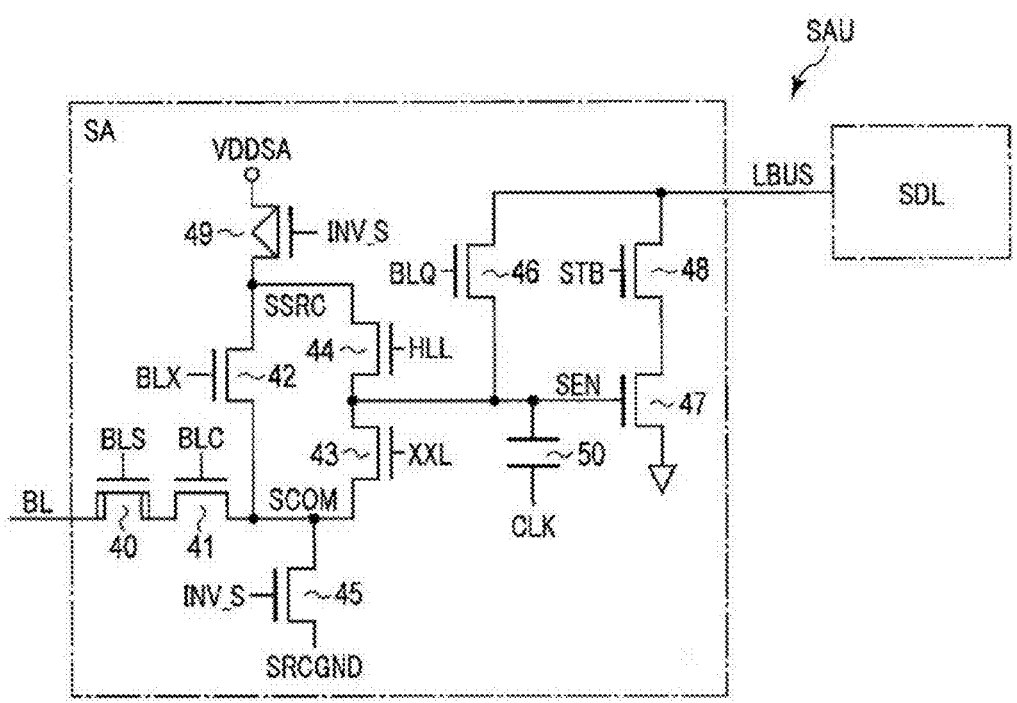
FIG. 8 is a circuit diagram of a sense amplifier unit included in the semiconductor memory device according to the first embodiment.
Figure 15:
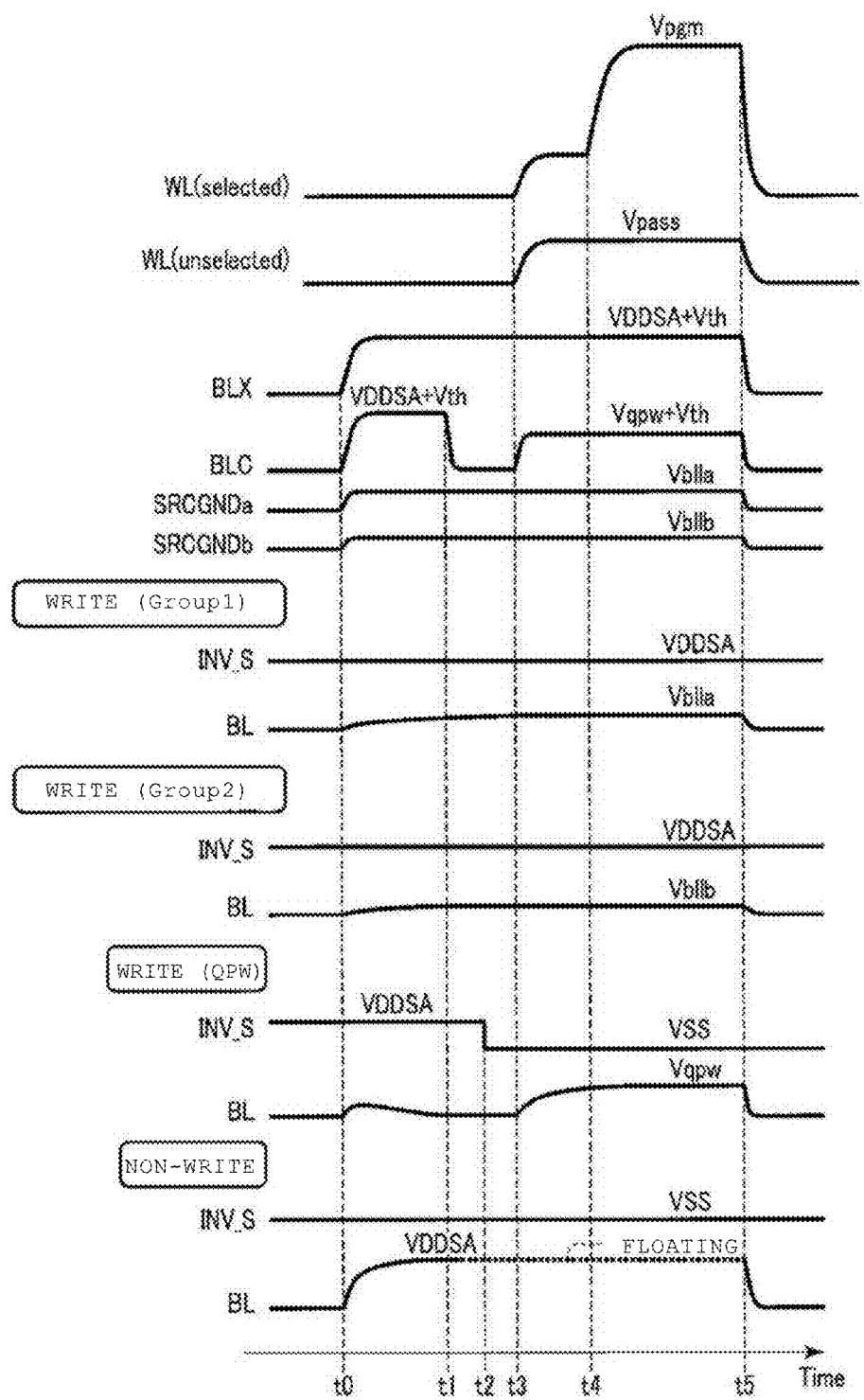
FIG. 15 is a write operation timing diagram of a semiconductor memory device according to a fourth embodiment.

With reference to FIGS. 8 and 15, the correction write operation of the semiconductor memory device 1 using the QPW method will be described.

First, the sequencer 14 sets a voltage of control signals BLX and BLC to VDDSA+Vth, and turns on the transistors 41 and 42 (time t0). In addition, the sequencer 14 sets the voltages of the nodes SRCGNDa and SRCGNDb to Vblla and Vbllb, respectively.

When a threshold voltage of a memory cell is less than a first level, the voltage Vblla is applied to the first bit line of Group 1 through the node SRCGNDa and the voltage Vbllb is applied to the first bit line BL of Group 2 through the node SRCGNDb. In addition, the voltage VDDSA is given to the second bit line BL. An influence of coupling between the first bit line BL and the second bit line BL occurs (it is shown when performing a write operation using a voltage Vqpw (QPW)) in the first bit line BL next to the second bit line.

Next, the sequencer 14 sets a voltage of the control signal BLC to VSS (time t1).

Then, the sequencer 14 sets a voltage of the node INV_S of the sense amplifier unit SAU connected to the first bit lines BL of Groups 1 and 2 to an "L" level (voltage VSS) (time t2) when performing a write operation using the voltage Vqpw.

Next, the sequencer 14 turns on the select transistor ST1 of a finger FNG including a selected memory cell and turns off the select transistor ST1 of a finger FNG not including a selected memory cell in a selected block. In addition, the sequencer 14 turns off the select transistor ST2 of the selected block. The sequencer 14 turns off the select transistors ST1 and ST2 in a non-selected block. Moreover, the sequencer 14 sets a voltage of the control signal BLC to Vqpw+Vth, and sets a voltage of the first bit line BL connected to a memory cell whose threshold voltage is a first level or more to Vqpw.

In addition, the sequencer 14 sets voltages of selected and non-selected word lines to Vpass (time t3).

Then, the sequencer 14 sets a voltage of a selected word line WL to a program voltage Vpgm (time t4).

A high voltage of (Vpgm-Vblla) is applied between the gate and the channel of the selected memory cell connected to the first bit line BL of Group 1, and data are written into the selected memory cell. In addition, a high voltage of (Vpgm-Vbllb) is applied between the gate and the channel of the selected memory cell connected to the first bit line BL of Group 2, and data are written into the selected memory cell.

In NAND strings connected to the second bit line BL, in the same manner as in the first embodiment, a channel region is in a floating state. Accordingly, the high electric field is not applied to the tunnel oxide film, and data are not written into a memory cell.

When performing a write operation using the voltage Vpqw, a high voltage of (Vpgm-Vqpw) is applied between the gate and the channel of the selected memory cell connected to the first bit line BL, and data are written into the selected memory cell. Since VDDSA>Vqpw>Vblla>Vbllb is satisfied, a shifted amount of a threshold voltage of a memory cell applied to the voltage Vqpw is smaller than that of a memory cell applied to the voltage Vblla or Vbllb.

In NAND strings of a non-selected block, in the same manner as in the first embodiment, the channel region is in a floating state. Accordingly, the high electric field is not applied to the tunnel oxide film, and data are not written into a memory cell of the non-selected block.

As described above, one time write loop is ended (time t5). The other operations are the same as in the first embodiment.

With the above configurations, the semiconductor memory device 1 according to the fourth embodiment may have a narrower distribution of threshold voltages of the memory cell than in the first to the third embodiments.

Fifth Embodiment

Figure 16:
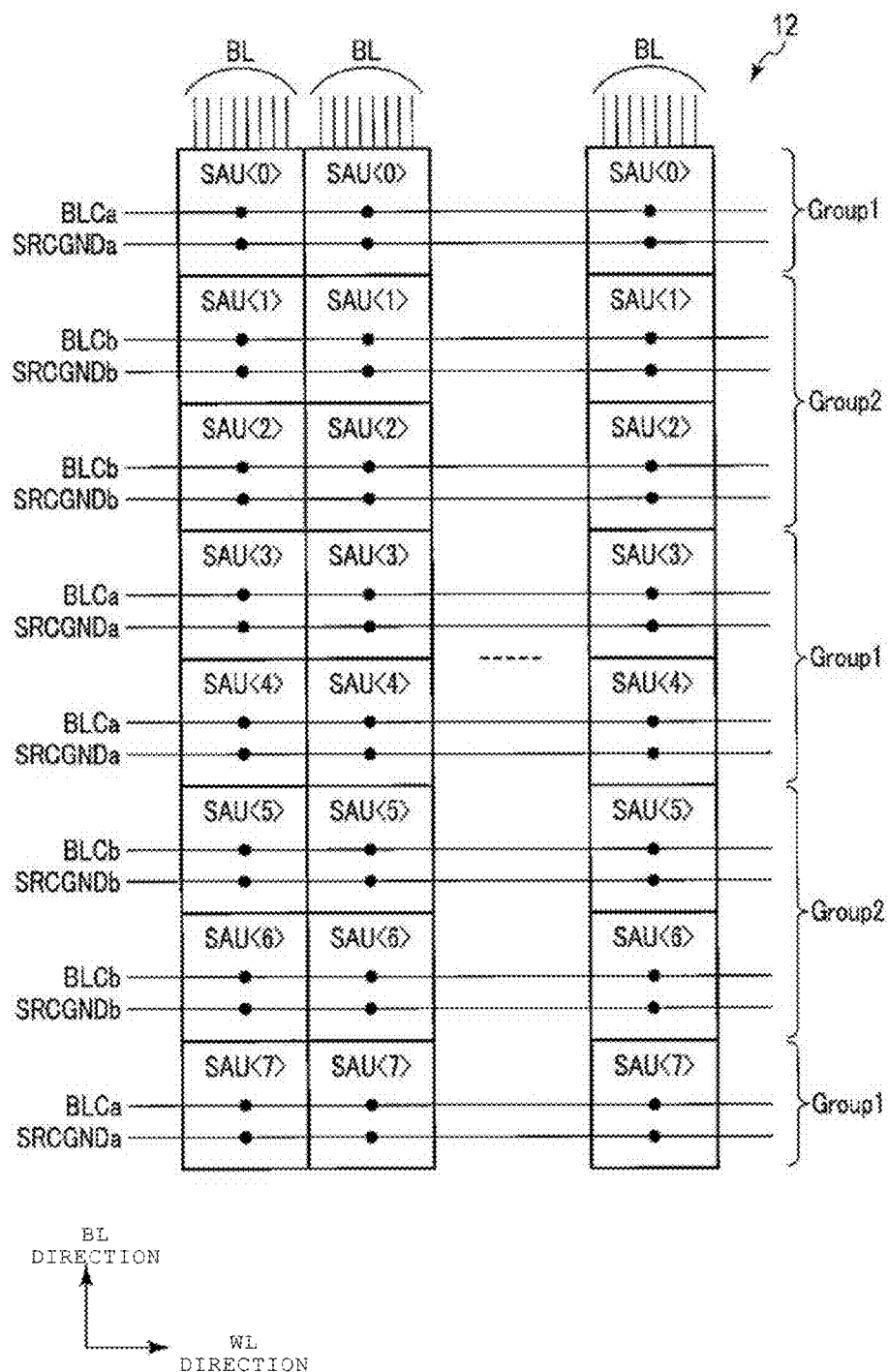
FIG. 16 is a block diagram of a sense amplifier included in a semiconductor memory device according to a fifth embodiment.

A semiconductor memory device 1 according to a fifth embodiment sets a voltage applied to the first bit line BL which is connected to the semiconductor pillars 27 as in the fourth embodiment. FIG. 16 shows a configuration of the sense amplifier module 12, and only differences from the fourth embodiment will be described.

A wiring which is supplied with a control signal BLCa is connected to a sense amplifier unit SAU of Group 1, and a wiring which is supplied with a control signal BLCb is connected to a sense amplifier unit SAU of Group 2.

A circuit diagram of the sense amplifier unit SAU has a different signal input into the transistor 41 from in FIG. 8. A control signal BLCa is input into a gate of the transistor 41 of the sense amplifier unit SAU of Group 1, and a control signal BLCb is input into the gate of the transistor 41 of the sense amplifier unit SAU of Group 2. The other configurations are the same as in the first embodiment.

Figure 17:
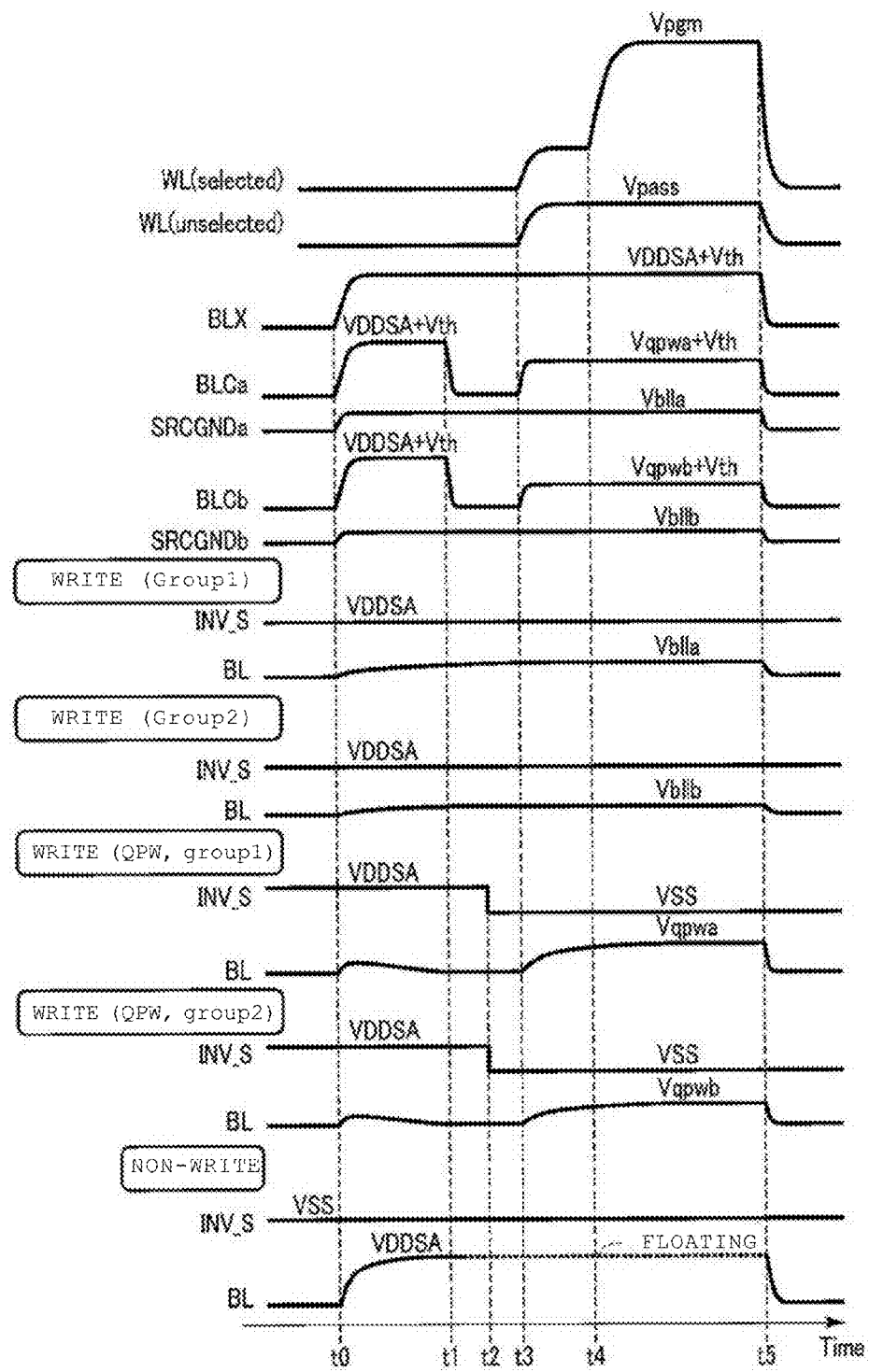
FIG. 17 is a write operation timing diagram of the semiconductor memory device according to the fifth embodiment.

FIG. 17 is a timing diagram of a write operation using the QPW method of the first semiconductor memory device 1 according to the fifth embodiment, and only differences from that of the fourth embodiment will be described. When a threshold voltage of a memory cell is the first level or more, a write operation using voltages Vqpwa and Vqpwb is performed. A voltage Vqpwa is higher than the voltage Vblla and is lower than the voltage VDDSA. The voltage Vqpwb is higher than the voltage Vbllb, and is lower than the voltage VDDSA.

At time t0, the sequencer 14 sets a voltage of the control signals BLCa and BLCb to VDDSA+Vth. Accordingly, the voltage VDDSA is applied to the second bit line BL. At time t1, the sequencer 14 sets a voltage of the control signals BLCa and BLCb to VSS.

At time t2, when performing a write operation using the voltages Vqpwa and Vqpwb, the sequencer 14 sets the node INV_S of the sense amplifier unit SAU connected to the first bit line BL of Groups 1 and 2 to an "L" level (voltage VSS).

At time t3, Vqpwa+Vth and Vqpwb+Vth are applied as control signals BLCa and BLCb, respectively. Accordingly, the first bit lines BL of Groups 1 and 2 are charged to the voltages Vqpwa and Vqpwb, respectively.

At time t4, a program voltage Vpqm is applied to the selected word line WL. When performing a write operation using the voltages Vqpwa and Vqpwb, the high electric field of (Vpqm-Vqpwa) is applied between the gate and the channel of the selected memory cell connected to the first bit line BL of Group 1, and data are written into the selected memory cell. On the other hand, the high electric field of (Vpqm-Vqpwb) is applied between the gate and the channel of the selected memory cell connected to the first bit line BL of Group 2, and data are written into the selected memory cell. Accordingly, when performing the write operation using the voltages Vqpwa and Vqpwb, it is possible to perform a write into the selected memory cell connected to the first bit line of Groups 1 and 2 at different speeds.

With the above configuration, the semiconductor memory device 1 according to the fifth embodiment may have a narrower distribution of threshold voltages of a memory cell than in the first to the fourth embodiments.

Sixth Embodiment

A semiconductor memory device 1 according to a sixth embodiment is classified into three groups according to a position of the semiconductor pillars 27, and applies a voltage which is different for each group to the first bit line BL when writing data.

Figure 18:
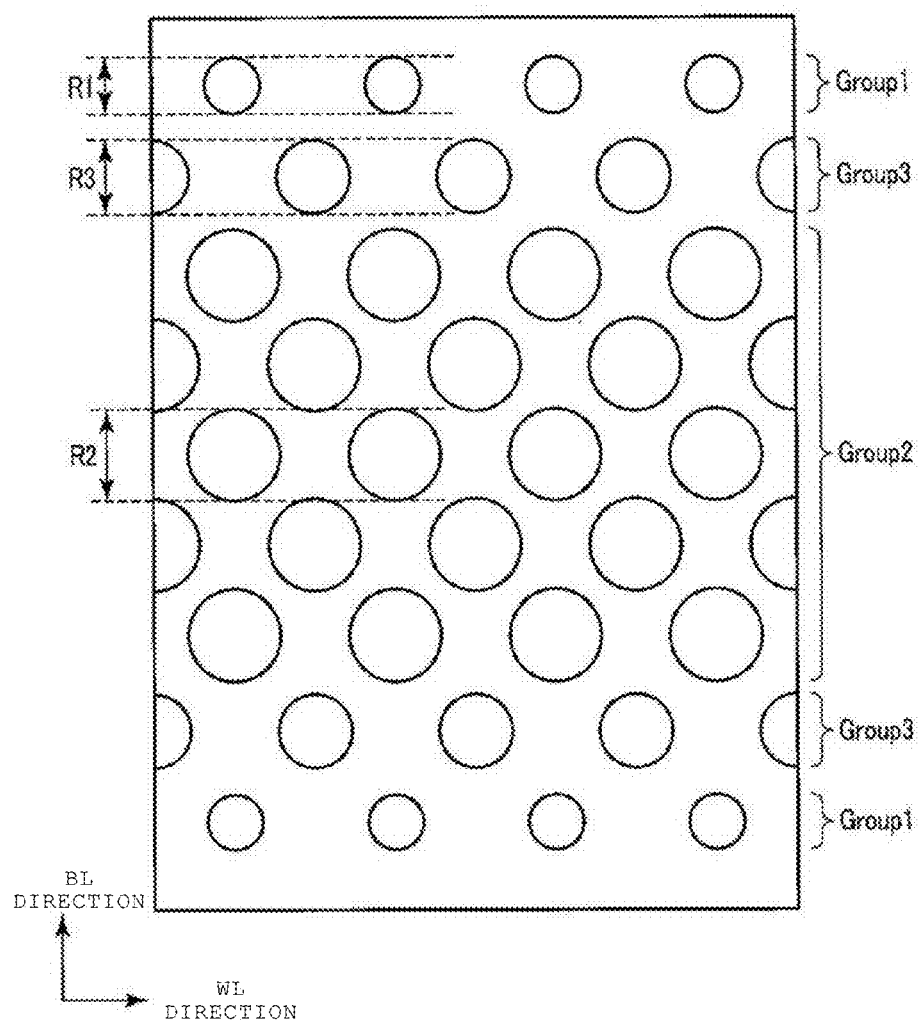
FIG. 18 is a plan view of a semiconductor pillar included in a semiconductor memory device according to a sixth embodiment.

When the semiconductor pillars 27 are arranged in a zigzag pattern (for example, when the semiconductor pillars 27 are arranged in the staggered pattern as shown in FIG. 18), diameters of the semiconductor pillars 27 vary between an end in an X direction and a center of a finger FNG, and also diameters of the semiconductor pillars 27 between these two positions are different from the diameters of the semiconductor pillars 27 at the end and at the center in some cases.

There, the semiconductor memory device 1 according to the sixth embodiment classifies a plurality of semiconductor pillars 27 into three groups (Groups 1, 2, and 3) in each finger FNG. Groups 1 and 2 are the same as in the first embodiment. Group 3 indicates semiconductor pillars 27 arranged between Groups 1 and 2. A diameter R3 of the semiconductor pillars of Group 3 is greater than the diameter R1 of the semiconductor pillars 27 of Group 1, and is smaller than the diameter R2 of the semiconductor pillars 27 of Group 2.

The sense amplifier module 12 includes a node SRCGNDc provided in a sense amplifier unit SAU of Group 3. The other configurations are the same as in FIG. 7.

The correction write operation of the semiconductor memory device 1 according to the sixth embodiment is performed by giving a voltage Vbllc to the first bit line BL of Group 3 through the node SRCGNDc. Voltage values have a relationship of Vblla>Vbllc>Vbllb. The other operations are the same as in the first embodiment.

With the above configuration, the semiconductor memory device 1 according to the sixth embodiment may obtain the same effects as in the first embodiment.

The plurality of semiconductor pillars 27 may be classified into four or more groups in each finger FNG. In order to generate a bit line voltage corresponding to four or more groups, the node SRCGND may be made to correspond to the number. Accordingly, the sequencer 14 may apply different voltages to the first bit line BL according to a corresponding group, and may adjust write speed into the selected memory cell.

Seventh Embodiment

Figure 19:
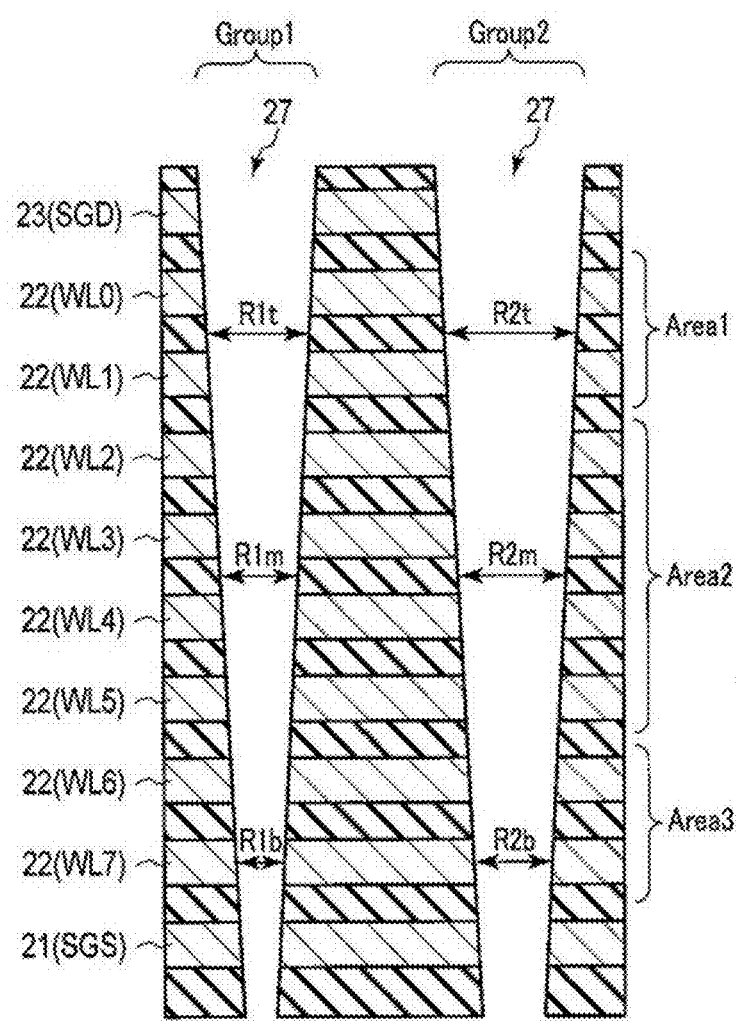
FIG. 19 is a sectional view of a semiconductor pillar included in a semiconductor memory device according to a seventh embodiment.

A semiconductor memory device 1 according to a seventh embodiment classifies a memory cell into a plurality of areas according to a stacking position, and applies a different bit line voltage for each area when wiring data. With reference to FIG. 19, a configuration of the semiconductor memory device 1 will be described. FIG. 19 is a sectional view of the semiconductor pillars 27 of FIG. 5, and shows each one of the semiconductor pillars 27 of Groups 1 and 2.

Diameters of the semiconductor pillars 27 become smaller from a top layer to a bottom layer. Specifically, a diameter of the semiconductor pillar 27 of Group 1 has a relationship of R1$t$ (diameter at the top layer)>R1$m$ (diameter at an intermediate layer)>R1$b$ (diameter at the bottom layer). Diameters of the semiconductor pillars 27 of Group 2 have a relationship of R2$t$ (diameter at the top layer)>R2$m$ (diameter at an intermediate layer)>R2$b$ (diameter at the bottom layer). When at the same layer, the diameter of the semiconductor pillars 27 of Group 1 is smaller than the diameter of the semiconductor pillars 27 of Group 2.

As the diameter of the semiconductor pillar 27 is smaller, the high electric field is applied between the gate and the channel of the selected memory cell, and the write speed into the memory cell is increased. Accordingly, a difference in the write speed into a memory cell due to an arrangement (in between Groups 1 and 2) of the semiconductor pillar 27 becomes larger at the bottom layer than the top layer in some cases. Therefore, the memory cell is classified into a plurality of areas according to a stacking position. As shown in FIG. 19, a stacking position of the memory cell is classified into, for example, three areas (Areas 1, 2, and 3). The diameter of the semiconductor pillar 27 has a relationship of Area 1 (for example, diameter R2$t$)>Area 2 (for example, diameter R2$m$)>Area 3 (for example, diameter R2$b$).

The correction write operation of the semiconductor memory device 1 may set different voltages Vblla and Vbllb according to a stacking position of the selected memory cell. For example, when the voltage Vblla corresponding to Areas 1 to 3 is set as Vblla1 to Vblla3, respectively, values of VBlla1 to VBlla3 have a relationship of Vblla1<Vblla2<Vblla3. When the voltage Vbllb corresponding to Areas 1 to 3 is set to be Vbllb1 to Vbllb3, respectively, values of Vbllb1 to Vbllb3 have a relationship of Vbllb1≤Vbllb2≤Vbllb3.

Since write speed into the selected memory cell corresponding to the semiconductor pillars 27 of Group 2 is slower than write speed into the selected memory cell corresponding to the semiconductor pillars 27 of Group 1, voltages of Vbllb1 to Vbllb3 may be the same as each other (for example, voltage VSS). The other operations are the same as in the first embodiment.

With the above configuration, the semiconductor memory device 1 according to the seventh embodiment may have a narrower distribution of threshold voltages of a memory cell for each layer than in the first to the sixth embodiments.

There may be an area to perform a normal write operation. In a memory cell at the top layer, there is no difference in the write speed into a memory cell due to the position of the semiconductor pillars 27, and a difference in the write speed into a memory cell due to the position of the semiconductor pillars 27 occurs in a memory cell at the bottom layer in some cases. In this case, the normal write operation may be performed in the memory cell at the top layer, and the correction write operation may be performed in the memory cell at the bottom layer. In this manner, the normal write operation and the correction write operation may be properly used for each area.

Write, read, and erase operations of the semiconductor memory device 1 may be configured in another manner. The write, read, and erase operations of the semiconductor memory device are described in, for example, International Patent Application No. 2013/073917, filed on Sep. 5, 2013, entitled "Semiconductor memory device and data writing method," Japanese Patent Application No. 2013/083870, filed on Dec. 18, 2013, entitled "Semiconductor memory device," International Patent Application No. 2013/674952, filed on Sep. 13, 2013, entitled "Semiconductor memory device," Japanese Patent Application No. 2013/188192, filed on Sep. 16, 2014, entitled "Semiconductor memory device," Japanese Patent Application No. 2014/174421, filed on Aug. 28, 2014, entitled "Semiconductor memory device and data erasing method," and U.S. patent application Ser. No. 13/235,396, filed on Sep. 18, 2011, entitled "Non-volatile semiconductor memory device." The entire contents of these patent applications are incorporated herein by reference.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

In each of the embodiments (1) In a read operation, a voltage applied to a word line selected in an A level of the read operation is between, for example, 0 V and 0.55 V. The voltage is not limited thereto, and may be in any of following ranges: 0.1 V to 0.24 V, 0.21 V to 0.31 V, 0.31 V to 0.4 V, 0.4 V to 0.5 V, and 0.5 V to 0.55 V.

A voltage applied to a word line selected in a B level of the read operation is between, for example, 1.5 V and 2.3 V. The voltage is not limited thereto, and may be in any of following ranges: 1.65 V to 1.8 V, 1.8 V to 1.95 V, 1.95 V to 2.1 V, and 2.1 V to 2.3 V.

A voltage applied to a word line selected in a C level of the read operation is between, for example, 3.0 V and 4.0 V. The voltage is not limited thereto, and may be in any of ranges: 3.0 V to 3.2 V, 3.2 V to 3.4 V, 3.4 V to 3.5 V, 3.5 V to 3.6 V, and 3.6 V to 4.0 V.

Time (tR) for a read operation may be in following ranges: for example, 25 μs to 38 μs, 38 μs to 70 μs, and 70 μs to 80 μS.

(2) The write operation includes the program operation and the verification operation described above. In the write operation, a voltage initially applied to a word line selected during the program operation is between, for example, 13.7 V to 14.3 V. The voltage is not limited thereto, and may be in any of following ranges: for example, 13.7 V to 14.0 V and 14.0 V to 14.6 V.

A voltage initially applied to a word line selected when writing odd numbered word line and a voltage initially applied to a word line selected when writing even numbered word line may be changed.

When the program operation is performed in an ISPP method (Incremental Step Pulse Program), for example, about 0.5 V is applied as a step-up voltage.

A voltage applied to a non-selected word line may be, for example, between 6.0 V to 7.3 V. The voltage is not limited thereto, and may be, for example, in 7.3 V to 8.4 V, and may be 6.0V or below.

Depending on whether the non-selected word line is an odd numbered word line or an even numbered word line, a pass voltage to be applied may be changed.

Time for a write operation (tProg) may be in following ranges: for example, 1,700 μs to 1,800 μs, 1,800 μs to 1,900 μs, and 1,900 μs to 2,000 μs.

(3) In the erase operation, a voltage initially applied to a well which is formed on a semiconductor substrate and the memory cell is arranged above is, for example, between 12 V to 13.6 V. The voltage is not limited thereto, and may be in following ranges: for example, 13.6 V to 14.8 V, 14.8 V to 19.0 V, 19.0 V to 19.8 V, and 19.8 V to 21 V.

Time (tErase) for the erase operation may be in following ranges: for example, 3,000 μs to 4,000 μs, 4,000 μs to 5,000 μs, and 5,000 μs to 9,000 μs.

(4) A structure of a memory cell has a charge storage layer arranged on the semiconductor substrate (silicon substrate) through a tunnel insulation film having a thickness of 4 to 10 nm. This charge storage layer may be made by an stacking structure of an insulation film such as SiN or SiON having a film thickness of 2 to 3 nm and poly-silicon having a film thickness of 3 to 8 nm. In addition, a metal such as Ru may be added to the poly-silicon. The charge storage layer has an insulation film on a top thereof. The insulation film has a silicon oxide film having a film thickness of 4 to 10 nm which is interposed between a lower layer high-k film having a film thickness of 3 to 10 nm and a upper layer high-k film having a film thickness of 3 to 10 nm. HfO and the like are mentioned for the high-k film. Moreover, a film thickness of the silicon oxide film may be thicker than a film thickness of the high-k film. A control electrode having a thickness of 30 nm to 70 nm is formed on the insulation film through a material having a thickness of 3 to 10 nm. Here, the material is a metal oxide film such as TaO, or a metal nitride film such as TaN. It is possible to use W and the like for the control electrode.

In addition, it is possible to form an air gap between memory cells.

What is claimed is:

1. A semiconductor memory device comprising:
   first and second plugs formed on a semiconductor substrate;
   a word line between the first and second plugs and above the semiconductor substrate;
   a first semiconductor pillar extending above the semiconductor substrate through the word line;
   a second semiconductor pillar extending above the semiconductor substrate through the word line;
   a first bit line electrically connected to the first semiconductor pillar; and
   a second bit line electrically connected to the second semiconductor pillar, wherein
   when writing same data in a first memory cell, which is electrically connected to the first bit line, and a second memory cell, which is electrically connected to the second bit line, a first voltage is applied to the first bit line and a second voltage that is different from the first voltage is applied to the second bit line.

2. The device according to claim 1, wherein a distance from the first semiconductor pillar to the first plug is less than a distance from the second semiconductor pillar to either the first plug or the second plug, and the first voltage is higher than the second voltage.

3. The device according to claim 2, wherein a diameter of the first semiconductor pillar is smaller than a diameter of the second semiconductor pillar.

4. The device according to claim 1, wherein a distance from the first semiconductor pillar to the first plug is less than a distance from the second semiconductor pillar to either the first plug or the second plug, and the first voltage is less than the second voltage.

5. The device according to claim 4, wherein a diameter of the first semiconductor pillar is greater than a diameter of the second semiconductor pillar.

6. The device according to claim 1, wherein
   when writing the same data in a third memory cell, which is electrically connected to the first bit line and above the first memory cell, a third voltage that is higher than the first voltage is applied to the first bit line.

7. The device according to claim 6, wherein a diameter of the first semiconductor pillar at the first memory cell is less than a diameter of the first semiconductor pillar at the third memory cell.

8. The device according to claim 1, further comprising:
a third semiconductor pillar extending above the semiconductor substrate through the word line; and
a third bit line electrically connected to the third semiconductor pillar, wherein
when writing the same data in a third memory cell, which is electrically connected to the third bit line, a third voltage is applied to the third bit line when writing in the third memory cell, the third voltage being different from the first and second voltages.

9. The device according to claim 8, wherein
a distance from the first semiconductor pillar to the first plug is less than a distance from the second semiconductor pillar to either the first plug or the second plug, and the distance from the second semiconductor pillar to the first plug is less than a distance from the third semiconductor pillar to either the first plug or the second plug, and
the first voltage is higher than the second voltage, and the second voltage is higher than the third voltage.

10. The device according to claim 1, wherein
a cross-sectional shape of the first semiconductor pillar is a circle, and
a cross-sectional shape of the second semiconductor pillar is an ellipse.

11. A semiconductor memory device comprising:
first, second, and third plugs formed on a semiconductor substrate;
a first word line between the first and second plugs and above the semiconductor substrate;
a second word line between the second and third plugs and above the semiconductor substrate;
first and second semiconductor pillars extending above the semiconductor substrate through the first word line;
third and fourth semiconductor pillars extending above the semiconductor substrate through the second word line;
a first bit line electrically connected to the first and fourth semiconductor pillars; and
a second bit line electrically connected to the second and third semiconductor pillars, wherein
a diameter of the first semiconductor pillar is less than each of diameters of the second and fourth semiconductor pillars, and
a diameter of the third semiconductor pillar is less than each of the diameters of the second and fourth semiconductor pillars.

12. The device according to claim 11, wherein
when writing same data in a first memory cell, which is electrically connected to the first bit line and between the first and second plugs, a second memory cell, which is electrically connected to the second bit line and between the first and second plugs, a third memory cell, which is electrically connected to the first bit line and between the second and third plugs, and a fourth memory cell, which is electrically connected to the second bit line and between the second and third plugs, a first voltage is applied to the first bit line when writing in the first memory cell, a second voltage that is different from the first voltage is applied to the second bit line when writing in the second memory cell, the first voltage is applied to the second bit line when writing in the third memory cell, and the second voltage is applied to the first bit line when writing in the fourth memory cell.

13. The device according to claim 12, wherein the first voltage is higher than the second voltage.

14. The device according to claim 13, wherein
a distance from the first semiconductor pillar to the first plug is less than a distance from the second semiconductor pillar to either the first plug or the second plug, and
a distance from the third semiconductor pillar to the second plug is less than a distance from the fourth semiconductor pillar to either the second plug or the third plug.

15. The device according to claim 13, wherein the first, second, third, and fourth semiconductor pillars are aligned along a bit line direction.

16. The device according to claim 13, wherein the second semiconductor pillar is between the first and third semiconductor pillars, and the third semiconductor pillar is between the second and fourth semiconductor pillars.

17. A method of writing a data having a first value in first and second memory cells of a semiconductor memory device, the semiconductor memory device including first and second plugs formed on a semiconductor substrate, a word line between the first and second plugs and above the semiconductor substrate, a first semiconductor pillar extending above the semiconductor substrate through the word line and forming a channel region of the first memory cell, a second semiconductor pillar extending above the semiconductor substrate through the word line and forming a channel region of the second memory cell, a first bit line electrically connected to the first semiconductor pillar, and a second bit line electrically connected to the second semiconductor pillar, said method comprising:
applying a first voltage to the first bit line when writing the data having the first value in the first memory cell; and
applying a second voltage, different from the first voltage, to the second bit line when writing the data having the first value in the second memory cell.

18. The method according to claim 17, wherein a distance from the first semiconductor pillar to the first plug is less than a distance from the second semiconductor pillar to either the first plug or the second plug, and the first voltage is higher than the second voltage.

19. The method according to claim 17, wherein a distance from the first semiconductor pillar to the first plug is less than a distance from the second semiconductor pillar to either the first plug or the second plug, and the first voltage is less than the second voltage.

20. The device according to claim 17, wherein diameters of the first and second semiconductor pillars are different.

* * * * *